(12) United States Patent
Jintyou et al.

(10) Patent No.: US 10,002,971 B2
(45) Date of Patent: Jun. 19, 2018

(54) SEMICONDUCTOR DEVICE AND DISPLAY DEVICE INCLUDING THE SEMICONDUCTOR DEVICE

(71) Applicant: Semiconductor Energy Laboratory Co., LTD., Atsugi-shi, Kanagawa-ken (JP)

(72) Inventors: Masami Jintyou, Tochigi (JP); Takahiro Iguchi, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 14/755,886

(22) Filed: Jun. 30, 2015

(65) Prior Publication Data

US 2016/0005873 A1 Jan. 7, 2016

(30) Foreign Application Priority Data

Jul. 3, 2014 (JP) .................................. 2014-137696

(51) Int. Cl.
*H01L 27/12* (2006.01)
*H01L 29/786* (2006.01)
(Continued)

(52) U.S. Cl.
CPC ...... *H01L 29/7869* (2013.01); *H01L 27/1225* (2013.01); *H01L 29/045* (2013.01);
(Continued)

(58) Field of Classification Search
None
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Benjamin Sandvik
(74) *Attorney, Agent, or Firm* — Nixon Peabody LLP; Jeffrey L. Costellia

(57) ABSTRACT

A change in electrical characteristics can be suppressed and reliability can be improved in a semiconductor device including a transistor having an oxide semiconductor. A semiconductor device includes a transistor, and the transistor includes an oxide semiconductor film over a first insulating film, a gate insulating film over the oxide semiconductor film, a gate electrode over the gate insulating film, a conductive film in contact with a side surface of the gate electrode in a channel length direction, and a second insulating film over the oxide semiconductor film. The oxide semiconductor film includes a first region overlapping with the gate electrode, a second region overlapping with the conductive film, and a third region in contact with the second insulating film. The third region includes a region having higher impurity element concentration than the second region.

29 Claims, 17 Drawing Sheets

(51) Int. Cl.
  *H01L 29/24* (2006.01)
  *H01L 29/04* (2006.01)
  *H01L 29/423* (2006.01)
  *H01L 29/49* (2006.01)
  *H01L 29/66* (2006.01)

(52) U.S. Cl.
  CPC ........ *H01L 29/24* (2013.01); *H01L 29/42384* (2013.01); *H01L 29/4908* (2013.01); *H01L 29/66969* (2013.01); *H01L 29/78621* (2013.01); *H01L 29/78696* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,705,358 | B2* | 4/2010 | Okamoto .......... H01L 29/42384 257/270 |
| 7,732,819 | B2 | 6/2010 | Akimoto et al. |
| 8,384,076 | B2 | 2/2013 | Park et al. |
| 8,772,768 | B2 | 7/2014 | Yamazaki |
| 8,878,177 | B2 | 11/2014 | Sasagawa et al. |
| 8,883,556 | B2 | 11/2014 | Yamazaki |
| 8,941,112 | B2 | 1/2015 | Yamazaki |
| 9,214,565 | B2* | 12/2015 | Sasagawa ............... H01L 21/34 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0278122 | A1 | 11/2009 | Hosono et al. |
| 2009/0280600 | A1 | 11/2009 | Hosono et al. |
| 2009/0283763 | A1* | 11/2009 | Park .................. H01L 29/78621 257/43 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0042670 | A1* | 2/2011 | Sato .................. H01L 29/78621 257/43 |
| 2011/0284844 | A1 | 11/2011 | Endo et al. |
| 2012/0161121 | A1* | 6/2012 | Yamazaki ......... H01L 29/78621 257/43 |
| 2012/0298987 | A1* | 11/2012 | Sakata ................ H01L 27/0688 257/43 |
| 2012/0315735 | A1 | 12/2012 | Koezuka et al. |
| 2012/0319183 | A1* | 12/2012 | Yamazaki ........... H01L 29/7782 257/288 |
| 2013/0127694 | A1 | 5/2013 | Kim et al. |
| 2013/0161608 | A1* | 6/2013 | Yamazaki ........... H01L 29/7869 257/43 |
| 2013/0277672 | A1 | 10/2013 | Sano et al. |
| 2014/0315349 | A1 | 10/2014 | Yamazaki |
| 2015/0125992 | A1 | 5/2015 | Yamazaki |
| 2015/0162452 | A1 | 6/2015 | Koezuka et al. |
| 2015/0221774 | A1 | 8/2015 | Yamazaki et al. |
| 2015/0263174 | A1 | 9/2015 | Yamazaki et al. |
| 2015/0295093 | A1 | 10/2015 | Yamazaki |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |

(56) References Cited

FOREIGN PATENT DOCUMENTS

| | | |
|---|---|---|
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2009-278115 A | 11/2009 |
| JP | 2012-009836 A | 1/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1067.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper: World-Largest (6.5') Flexible Full Color Top Emission AMOLED Display on Plastic Film and Its Bending Properties", SID Digest '09 : SID International Symposium of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Syposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperature over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Paper, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

100

100

100

SEMICONDUCTOR DEVICE AND DISPLAY DEVICE INCLUDING THE SEMICONDUCTOR DEVICE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic appliances such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique in which a transistor is manufactured using an amorphous oxide containing In, Zn, Ga, Sn, and the like as an oxide semiconductor is disclosed (see Patent Document 1). Furthermore, a technique in which a transistor using an oxide thin film and a self-aligned top-gate structure is manufactured is disclosed (see Patent Document 2).

Furthermore, a semiconductor device including, as a base insulating layer of an oxide semiconductor layer where a channel is formed, an insulating layer that releases oxygen by heating to reduce oxygen vacancies in the oxide semiconductor layer is disclosed (see Patent Document 3).

REFERENCES

Patent Documents

[Patent Document 1] Japanese Published Patent Application No. 2006-165529
[Patent Document 2] Japanese Published Patent Application No. 2009-278115
[Patent Document 3] Japanese Published Patent Application No. 2012-009836

SUMMARY OF THE INVENTION

As examples of a transistor including an oxide semiconductor film, an inverted staggered transistor (also referred to as a transistor having a bottom-gate structure), a planar transistor (also referred to as a transistor having a top-gate structure), and the like are given. In the case where a transistor including an oxide semiconductor film is used for a display device, an inverted staggered transistor is used more often than a planar transistor because a manufacturing process thereof is relatively simple and manufacturing cost thereof can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4 k×2 k pixels (3840 pixels in the horizontal direction and 2160 pixels in the perpendicular direction) or 8 k×4 k pixels (7680 pixels in the horizontal direction and 4320 pixels in the perpendicular direction)). Furthermore, as another problem, the occupation area of an inverted staggered transistor is larger than that of a planar transistor. Thus, with regard to a planar transistor including an oxide semiconductor film, development of a transistor which has a structure with stable semiconductor characteristics and high reliability and which is formed by a simple manufacturing process is desired.

Furthermore, in the case where a transistor is manufactured using an oxide semiconductor film for a channel region, an oxygen vacancy which is formed in the channel region of the oxide semiconductor film adversely affects the transistor characteristics. For example, formation of oxygen vacancies in a channel region of an oxide semiconductor film causes carrier generation. The carrier generation in the channel region of the oxide semiconductor film causes a change in the electrical characteristics, typically, a shift in the threshold voltage, of the transistor including the oxide semiconductor film in the channel region. Furthermore, there is a problem in that electrical characteristics vary among the transistors. Therefore, it is preferable that the amount of oxygen vacancy in the channel region of the oxide semiconductor film be as small as possible. Meanwhile, in the transistor including the oxide semiconductor film for the channel region, it is preferable that the amount of oxygen vacancy in regions of the oxide semiconductor film that are in contact with a source electrode and a drain electrode be as large as possible and the resistance of the regions be as low as possible to reduce a contact resistance between the regions and the source and the drain electrodes.

In view of the foregoing problems, an object of one embodiment of the present invention is to suppress a change in electrical characteristics and to improve reliability in a transistor including an oxide semiconductor. Another object of one embodiment of the present invention is to provide a planar transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device with low power consumption. Another object of one embodiment of the present invention is to provide a transistor including an oxide semiconductor and occupying a small area. Another object of one embodiment of the present invention is to provide a novel semiconductor device.

Note that the description of the above objects does not disturb the existence of other objects. In one embodiment of the present invention, there is no need to achieve all the objects. Other objects are apparent from and can be derived from the description of the specification and the like.

One embodiment of the present invention is a semiconductor device including a transistor. The transistor includes an oxide semiconductor film over a first insulating film, a gate insulating film over the oxide semiconductor film, a gate electrode over the gate insulating film, a conductive film in contact with a side surface of the gate electrode in a channel length direction, and a second insulating film over the oxide semiconductor film. The oxide semiconductor film includes a first region overlapping with the gate electrode, a second region overlapping with the conductive film, and a third region in contact with the second insulating film. The third region includes a region having higher impurity element concentration than the second region.

One embodiment of the present invention is a semiconductor device including a transistor. The transistor includes a first gate electrode, a first insulating film over the first gate electrode, an oxide semiconductor film over the first insulating film, a gate insulating film over the oxide semiconductor film, a second gate electrode over the gate insulating film, a conductive film in contact with a side surface of the second gate electrode in a channel length direction, and a second insulating film over the oxide semiconductor film. The oxide semiconductor film includes a first region overlapping with the second gate electrode, a second region overlapping with the conductive film, and a third region in contact with the second insulating film. The third region includes a region having higher impurity element concentration than the second region.

In any of the above structures, it is preferable that the third region function as a source region or a drain region of the transistor.

In any of the above structures, it is preferable that the third region include one or more of hydrogen, boron, carbon, nitrogen, fluorine, phosphorus, sulfur, and a rare gas. In any of the above structures, it is preferable that the third region include a region having higher hydrogen concentration than the second region.

In any of the above structures, the oxide semiconductor film preferably includes oxygen, In, Zn, and M (M is Ti, Ga, Sn, Y, Zr, La, Ce, Nd, or Hf). In any of the above structures, it is preferable that the oxide semiconductor film include a crystal part, and a portion in which a c-axis of the crystal part is parallel to a normal vector to a formation surface of the oxide semiconductor film be included.

Another embodiment of the present invention is a display device including the semiconductor device according to any one of the above structures and a display element. Another embodiment of the present invention is a display module including the display device and a touch sensor. Another embodiment of the present invention is an electronic appliance including the semiconductor device according to any one of the above structures, the display device, or the display module, and an operation key or a battery.

With one embodiment of the present invention, a change in electrical characteristics can be suppressed and reliability can be improved in a transistor including an oxide semiconductor. Furthermore, with one embodiment of the present invention, a planar transistor including an oxide semiconductor can be provided. Furthermore, with one embodiment of the present invention, a transistor including an oxide semiconductor and having high on-state current can be provided. Furthermore, with one embodiment of the present invention, a transistor including an oxide semiconductor and having low off-state current can be provided. Furthermore, with one embodiment of the present invention, a semiconductor device with low power consumption can be provided. Furthermore, with one embodiment of the present invention, a transistor including an oxide semiconductor and occupying a small area can be provided. Furthermore, with one embodiment of the present invention, a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
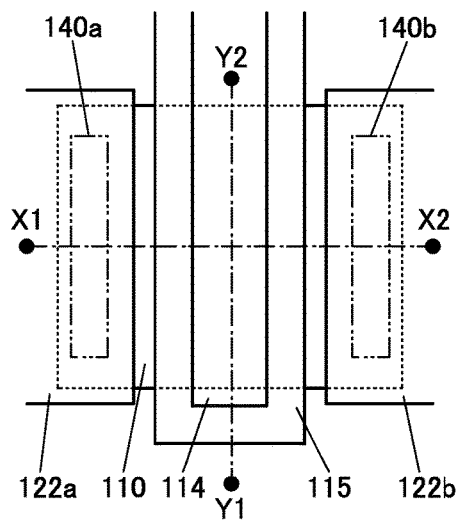
FIGS. 1A to 1C are a top view and cross-sectional views illustrating one mode of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first," "second," and "third" are used in order to avoid confusion among components, and the terms do not limit the components numerically.

Note that in this specification, terms for describing arrangement, such as "over," "above," "under," and "below," are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function." There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Furthermore, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

(Embodiment 1)

In this embodiment, examples of a semiconductor device including a transistor and a method for manufacturing the semiconductor device are described with reference to FIGS. 1A to 1C, FIG. 2, FIGS. 3A to 3C, FIGS. 4A and 4B, FIGS. 5A to 5C, FIGS. 6A to 6D, FIGS. 7A to 7C, FIGS. 8A to 8D, FIGS. 9A to 9D, and FIGS. 10A to 10C.

<Structure 1 of Semiconductor Device>

Figure 1B:
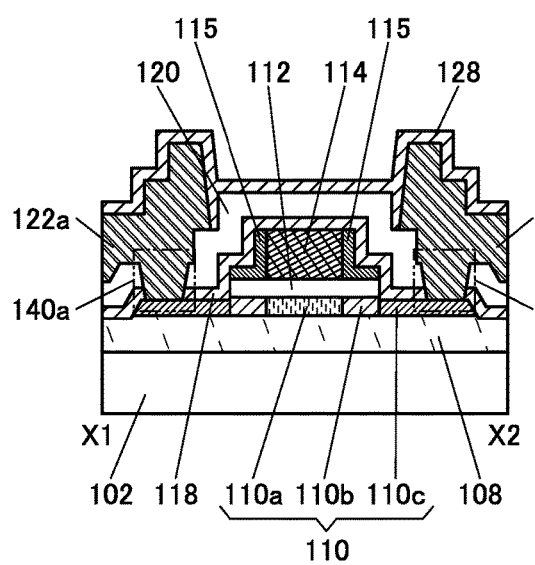
Figure 1C:
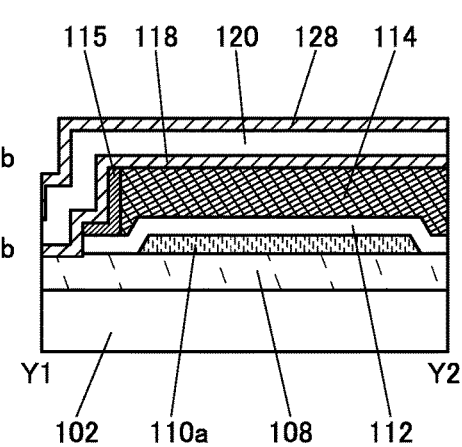

FIGS. 1A to 1C illustrate an example of a semiconductor device including a transistor. Note that the transistor illustrated in FIGS. 1A to 1C has a top-gate structure.

FIG. 1A is a top view of a semiconductor device including a transistor 100. FIG. 1B is a cross-sectional view along the dashed-dotted line X1-X2 in FIG. 1A. FIG. 1C is a cross-sectional view along the dashed-dotted line Y1-Y2 in FIG. 1A. Note that in FIG. 1A, a substrate 102, an insulating film 108, an insulating film 112, and the like are omitted for clarity. In a manner similar to that of FIG. 1A, some components are not illustrated in some cases in top views of transistors described below. Furthermore, the direction of the dashed-dotted line X1-X2 may be called a channel length (L) direction, and the direction of the dashed-dotted line Y1-Y2 may be called a channel width (W) direction.

The transistor 100 illustrated in FIGS. 1A to 1C includes the insulating film 108 (also referred to as a first insulating film) formed over the substrate 102, an oxide semiconductor film 110 over the insulating film 108, the insulating film 112 over the oxide semiconductor film 110, a conductive film 114 overlapping with the oxide semiconductor film 110 with the insulating film 112 provided therebetween, a conductive film 115 over the insulating film 112 and in contact with a side surface of the conductive film 114 at least in the channel length direction, and an insulating film 118 (also referred to as a second insulating film) over the oxide semiconductor film 110, the conductive film 114, and the conductive film 115. Furthermore, the oxide semiconductor film 110 has a first region 110a overlapping with the conductive film 114, second regions 110b overlapping with the conductive film 115, and third regions 110c in contact with the insulating film 118. Furthermore, the third regions 110c include regions having higher impurity element concentration than the second regions 110b.

The transistor 100 may include an insulating film 120 over the insulating film 118, a conductive film 122a electrically connected to the oxide semiconductor film 110 through an opening portion 140a provided in the insulating film 118 and the insulating film 120, and a conductive film 122b electrically connected to the oxide semiconductor film 110 through an opening portion 140b provided in the insulating film 118 and the insulating film 120. An insulating film 128 covering the insulating film 120 and the conductive films 122a and 122b may be provided over the transistor 100. Note that the insulating film 120 and the insulating film 128 function as protective insulating films.

The first region 110a in the oxide semiconductor film 110 functions as a channel region. The second regions 110b between which the first region 110a is provided function as first low-resistance regions. The third regions 110c between which the second regions 110b are provided function as second low-resistance regions as well as a source region and a drain region of the transistor 100.

Furthermore, the insulating film 112 functions as a gate insulating film, and the conductive film 114 functions as a gate electrode. The conductive film 115 functions as a gate electrode. In other words, the gate electrode of the transistor 100 includes the conductive film 114 and the conductive film 115. Note that the gate electrode of the transistor 100 may consist of only the conductive film 114 to have the shape illustrated in FIG. 1B (a gate electrode shape with a lower portion larger than an upper portion). However, when the gate electrode consists of only the conductive film 114 to have the shape illustrated in FIG. 1B, processing is difficult. In contrast, when the conductive film 114 and the conductive film 115 form the gate electrode as illustrated in FIG. 1B, easy and uniform processing is achievable. Moreover, formation of the conductive film 115 allows the practitioner to optimize the length of an overlap region described later as needed, which is preferable. Note that the conductive film 115 preferably has an L shape or an inverted-L shape at least in a cross section in the channel length direction, as illustrated in FIG. 1B. Furthermore, the conductive film 122a functions as one of a source electrode and a drain electrode, and the conductive film 122b functions as the other of the source electrode and the drain electrode.

Furthermore, the insulating film 108 contains oxygen and has a function of supplying oxygen to the oxide semiconductor film 110. Oxygen vacancies which can be formed in the oxide semiconductor film 110 can be filled with oxygen supplied from the insulating film 108. Furthermore, the insulating film 118 contains hydrogen and has a function of supplying hydrogen to the oxide semiconductor film 110.

In the oxide semiconductor film 110, the second regions 110b and the third regions 110c contain an element which forms an oxygen vacancy. Hereinafter, the elements which form oxygen vacancies are described as impurity elements. Typical examples of impurity elements are hydrogen, boron, carbon, nitrogen, fluorine, phosphorus, sulfur, chlorine, and rare gas elements. Typical examples of rare gas elements are helium, neon, argon, krypton, and xenon.

When the impurity element is added to the oxide semiconductor film, a bond between a metal element and oxygen in the oxide semiconductor film is cut, whereby an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, carrier density is increased in the oxide semiconductor film, and the oxide semiconductor film has higher conductivity.

Figure 2:
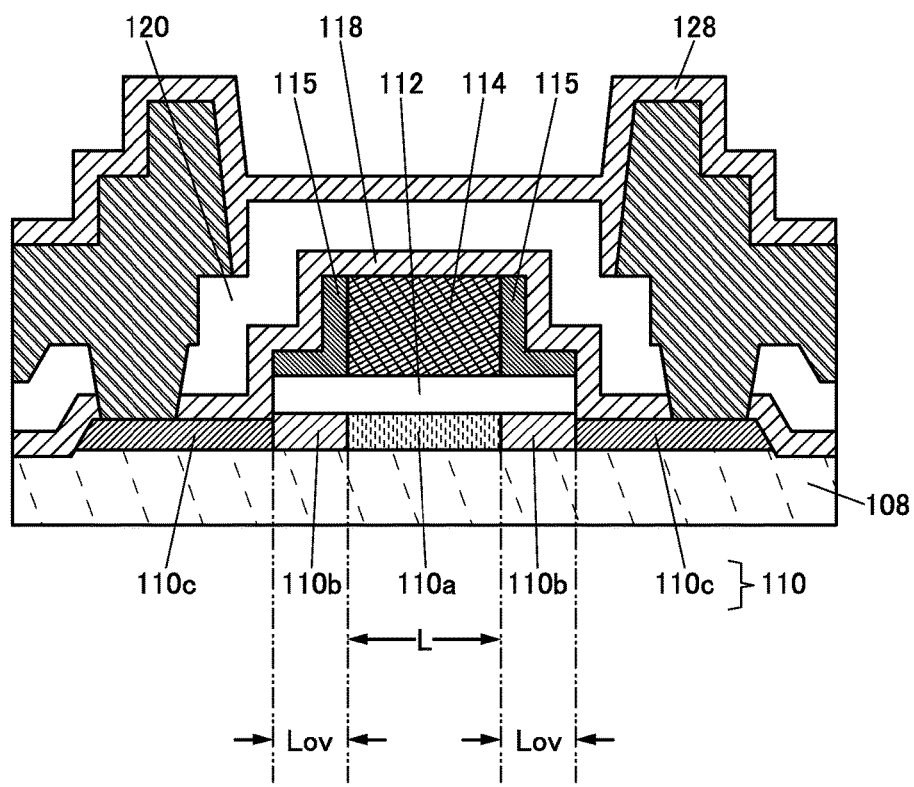
FIG. 2 is a cross-sectional view illustrating one mode of a semiconductor device.

FIG. 2 is an enlarged view of the vicinity of the oxide semiconductor film 110. Note that in the case where a portion illustrated in FIG. 2 has a function similar to that described above, the same hatch pattern is applied to the portion, and the portion is not especially denoted by a reference numeral in some cases.

A region in which the carrier density of the oxide semiconductor film is increased and the conductivity thereof is increased (hereinafter such a region is referred to as a low-resistance region) is formed in a cross section in the channel length direction of the oxide semiconductor film 110. In the oxide semiconductor film 110, the first region 110a functions as the channel region, the second regions 110b function as the first low-resistance regions, and the third regions 110c function as the second low-resistance regions. Note that the channel length L corresponds to the length of the first region 110a.

Alternatively, as illustrated in FIG. 2, in the cross section in the channel length direction, the second regions 110b each have a region overlapping with the conductive film 115 with the insulating film 112 provided therebetween. The region functions as an overlap region. The length of the overlap region in the channel length direction is referred to as $L_{ov}$. $L_{ov}$ is preferably smaller than 20%, smaller than 10%, smaller than 5%, or smaller than 2% of the channel length L. Since the second regions 110b and the conductive film 115 have the overlap regions, hot-carrier degradation of the transistor 100 can be suppressed. Furthermore, since the second regions 110b and the conductive film 115 have the overlap regions, the resistance of the second regions 110b can be low. For example, the resistance is lower when the second regions 110b overlap with a conductive film than when the second regions 110b overlap with an insulating film, e.g., a sidewall insulating film.

Note that as illustrated in FIG. 2, in the cross-sectional shape in the channel length direction, the boundaries between the first region 110a and the second regions 110b coincide with or substantially coincide with bottom end portions of the conductive film 114, with the insulating film 112 provided between the conductive film 114 and the boundaries. That is, in a top surface shape, the boundaries between the first region 110a and the second regions 110b coincide with or substantially coincide with the bottom end portions of the conductive film 114.

The third regions 110c include regions having higher impurity element concentration than the second regions 110b. In other words, the resistance of the second regions 110b is higher than that of the third regions 110c. Thus, the second regions 110b function as LDD regions. When the oxide semiconductor film 110 includes the second regions 110b having lower impurity concentration and higher resistance than the third regions 110c, an electric field in the drain region can be relieved. Thus, change in the threshold voltage of the transistor due to the electric field of the drain region can be reduced.

As shown in FIG. 2, the third regions 110c each have a region thinner than the first region 110a and the second regions 110b. In some cases, the thin region has a region with a thickness smaller than that of the first region 110a and the second regions 110b, i.e., that of the region of the oxide semiconductor film that overlaps with the insulating film 112, by greater than or equal to 0.1 nm and less than or equal to 5 nm. The region of the insulating film 108 that overlaps with the oxide semiconductor film 110 and the region of the insulating film 108 that does not overlap with the oxide semiconductor film 110 have different thicknesses in some cases. The region of the insulating film 108 not overlapping with the oxide semiconductor film 110 has a region with a thickness that is smaller than that of the region of the insulating film 108 overlapping with the oxide semiconductor film 110 by greater than or equal to 0.1 nm and less than or equal to 5 nm in some cases.

In this manner, in the oxide semiconductor film of the semiconductor device of one embodiment of the present invention, the channel region and two kinds of low-resistance regions can be formed in a self-aligned manner with the use of the gate electrode and the conductive film formed on the side surface of the gate electrode at least in the channel length direction. Accordingly, a change in the electrical characteristics of the transistor including the oxide semiconductor film can be suppressed and reliability can be improved.

Note that although the conductive film 115 is formed using a conductive film in this embodiment, one embodiment of the present invention is not limited to this structure and for example, the conductive film 115 may be formed using a semiconductor film or an insulating film. In that case, in the channel length direction, an overlap region is not formed and an offset region (also called Loff) is formed.

Next, details of other elements included in the semiconductor device illustrated in FIGS. 1A to 1C are described.

<Substrate>

As the substrate 102, any of a variety of substrates can be used without particular limitation. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As an example of a glass substrate, a barium borosilicate glass substrate, an aluminoborosilicate glass substrate, a soda lime glass substrate, or the like can be given. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. In particular, by forming the transistor with the use of a semiconductor substrate, a single crystal substrate, an SOI substrate, or the like, transistors with fewer variations in characteristics, sizes, shapes, or the like, with high current supply capability, and with small sizes can be formed. By forming a circuit using such a transistor, power consumption of the circuit can be reduced or the circuit can be highly integrated.

A flexible substrate may be used as the substrate 102, and the transistor may be provided directly on the flexible substrate. Alternatively, a separation layer may be provided between the substrate 102 and the transistor. The separation layer can be used when part or the whole of a semiconductor device formed over the separation layer is separated from the substrate 102 and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or a reduction in weight or thickness can be achieved.

<First Insulating Film>

The insulating film 108 can be formed by a sputtering method, a CVD method, an evaporation method, a pulsed laser deposition (PLD) method, a printing method, a coating method, or the like as appropriate. The insulating film 108 can be formed with a single layer or a stack including, for example, an oxide insulating film or a nitride insulating film. Note that an oxide insulating film is preferably used for at least a region of the insulating film 108 which is in contact with the oxide semiconductor film 110, in order to improve characteristics of the interface with the oxide semiconductor film 110. An oxide insulating film that releases oxygen by heating is preferably used as the insulating film 108, in which case oxygen contained in the insulating film 108 can be moved to the oxide semiconductor film 110 by heat treatment.

The thickness of the insulating film 108 can be greater than or equal to 50 nm, greater than or equal to 100 nm and less than or equal to 3000 nm, or greater than or equal to 200 nm and less than or equal to 1000 nm. With the use of the thick insulating film 108, the amount of oxygen released from the insulating film 108 can be increased, and the interface state at the interface between the insulating film 108 and the oxide semiconductor film 110 and oxygen vacancy included in the first region 110a functioning as the channel region of the oxide semiconductor film 110 can be reduced.

The insulating film 108 can be formed with a single layer or a stack including, for example, silicon oxide, silicon oxynitride, silicon nitride oxide, silicon nitride, aluminum oxide, hafnium oxide, gallium oxide, or a Ga—Zn oxide. In this embodiment, a stack including a silicon nitride film and a silicon oxynitride film is used as the insulating film 108. When the insulating film 108 is the stack including the silicon nitride film as a lower layer and the silicon oxynitride film as an upper layer, oxygen can be efficiently introduced into the oxide semiconductor film 110.

<Oxide Semiconductor Film>

The oxide semiconductor film 110 is typically formed using a metal oxide such as an In—Ga oxide, an In—Zn oxide, or an In-M-Zn oxide (M is Mg, Al, Ti, Ga, Sn, Y, Zr, La, Ce, Nd, or Hf). Note that the oxide semiconductor film 110 has a light-transmitting property.

Note that in the case where the oxide semiconductor film 110 is an In-M-Zn oxide, when the summation of In and M is assumed to be 100 atomic %, the proportions of In and M are as follows: the proportions of In and M are preferably set to be greater than 25 atomic % and less than 75 atomic %, respectively, or greater than 34 atomic % and less than 66 atomic %, respectively.

The energy gap of the oxide semiconductor film 110 is 2 eV or more, 2.5 eV or more, or 3 eV or more.

The thickness of the oxide semiconductor film 110 can be greater than or equal to 3 nm and less than or equal to 200 nm, greater than or equal to 3 nm and less than or equal to 100 nm, or greater than or equal to 3 nm and less than or equal to 60 nm.

In the case where the oxide semiconductor film 110 is an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, or the like is preferable. Note that the atomic ratios of metal elements in the formed oxide semiconductor film 110 vary from the above atomic ratio of metal elements of the sputtering target within a range of ±40% as an error.

When silicon or carbon that is one of elements belonging to Group 14 is contained in the oxide semiconductor film 110, oxygen vacancies are increased in the oxide semiconductor film 110, and the oxide semiconductor film 110 becomes an n-type film. Thus, the concentration of silicon or carbon (the concentration is measured by secondary ion mass spectrometry) of the oxide semiconductor film 110, in particular, the first region 110a functioning as the channel region, can be lower than or equal to $2\times10^{18}$ atoms/cm$^3$, or lower than or equal to $2\times10^{17}$ atoms/cm$^3$. As a result, the transistor has positive threshold voltage (normally-off characteristics).

Furthermore, the concentration of alkali metal or alkaline earth metal of the oxide semiconductor film 110, in particular, the first region 110a functioning as the channel region, which is measured by secondary ion mass spectrometry, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the first region 110a. As a result, the transistor has positive threshold voltage (normally-off characteristics).

Furthermore, when nitrogen is contained in the oxide semiconductor film 110, in particular, the first region 110a functioning as the channel region, electrons serving as carriers are generated, carrier density is increased, and the region becomes an n-type in some cases. Thus, a transistor including an oxide semiconductor film which contains nitrogen is likely to have normally-on characteristics. For this reason, nitrogen in the oxide semiconductor film, in particular, the first region 110a, is preferably reduced as much as possible. The nitrogen concentration, which is measured by secondary ion mass spectrometry, can be set to, for example, lower than or equal to $5\times10^{18}$ atoms/cm$^3$.

When the impurity element in the oxide semiconductor film 110, in particular, the first region 110a functioning as the channel region, is reduced, the carrier density of the oxide semiconductor film can be lowered. Therefore, the oxide semiconductor film 110, in particular, the first region 110a can have a carrier density less than or equal to $1\times10^{17}$/cm$^3$, less than or equal to $1\times10^{15}$/cm$^3$, less than or equal to $1\times10^{13}$/cm$^3$, or less than or equal to $1\times10^{11}$/cm$^3$.

Note that an oxide semiconductor film with a low impurity concentration and a low density of defect states can be used for the oxide semiconductor film 110, in which case the transistor can have more excellent electrical characteristics. Here, the state in which the impurity concentration is low and the density of defect states is low (the amount of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current. Thus, the transistor whose channel region is formed in the oxide semiconductor film has a small variation in electrical characteristics and high reliability in some cases.

The oxide semiconductor film 110 may have a non-single-crystal structure, for example. The non-single-crystal structure includes a c-axis aligned crystalline oxide semiconductor (CAAC-OS) which is described later, a polycrystalline structure, a microcrystalline structure described later, or an amorphous structure, for example. Among the non-single-crystal structure, the amorphous structure has the highest density of defect states, whereas CAAC-OS has the lowest density of defect states.

Note that the oxide semiconductor film 110 may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

Note that in the oxide semiconductor film 110, the crystallinity of the first region 110a is different from the crystallinity of each of the second regions 110b and the third regions 110c in some cases. Specifically, in the oxide semiconductor film 110, the crystallinity of the first region 110a is higher than the crystallinity of each of the second regions 110b and the third regions 110c. This is because, when the impurity element is added to the second regions 110b and the third regions 110c, the second regions 110b and the third regions 110c are damaged and thus have lower crystallinity.

<Insulating Film Functioning as Gate Insulating Film>

The insulating film 112 can be formed with a single layer or a stack using an oxide insulating film or a nitride insulating film. Note that an oxide insulating film is preferably used for at least a region of the insulating film 112 which is in contact with the oxide semiconductor film 110, in order to improve characteristics of the interface with the oxide semiconductor film 110. The insulating film 112 can be formed with a single layer or a stack using, for example, silicon oxide, silicon oxynitride, silicon nitride oxide, silicon nitride, aluminum oxide, hafnium oxide, gallium oxide, or a Ga—Zn oxide.

Furthermore, it is possible to prevent outward diffusion of oxygen from the oxide semiconductor film 110 and entry of hydrogen, water, and the like into the oxide semiconductor film 110 from the outside by providing an insulating film having a blocking effect against oxygen, hydrogen, water, and the like as the insulating film 112. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating film 112 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

An oxide insulating film that releases oxygen by heating is preferably used as the insulating film 112, in which case oxygen contained in the insulating film 112 can be moved to the oxide semiconductor film 110 by heat treatment.

The thickness of the insulating film 112 can be greater than or equal to 5 nm and less than or equal to 400 nm, greater than or equal to 5 nm and less than or equal to 300 nm, or greater than or equal to 10 nm and less than or equal to 250 nm.

<Conductive Film>

The conductive film 114, the conductive film 115, and the conductive films 122a and 122b can be formed by a sputtering method, a vacuum evaporation method, a pulsed laser deposition (PLD) method, a thermal CVD method, or the like. The conductive film 114, the conductive film 115, and the conductive films 122a and 122b can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The conductive film 114, the conductive film 115, and the conductive films 122a and 122b may each have a single-layer structure or a stacked-layer structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film in which aluminum and one or more elements selected from titanium, tantalum, tungsten, molybdenum, chromium, neodymium, and scandium are combined may be used.

The conductive film 114, the conductive film 115, and the conductive films 122a and 122b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon oxide (ITSO). It is also possible to have a layered structure of the above light-transmitting conductive material and the above metal element.

The thicknesses of the conductive film 114 and the conductive films 122a and 122b each can be greater than or equal to 30 nm and less than or equal to 500 nm, or greater than or equal to 100 nm and less than or equal to 400 nm. The thickness of the conductive film 115 can be greater than or equal to 10 nm and less than or equal to 300 nm, preferably greater than or equal to 30 nm and less than or equal to 100 nm.

<Second Insulating Film>

The insulating film 118 contains hydrogen. The insulating film 118 containing hydrogen is a nitride insulating film, for example. The nitride insulating film can be formed using silicon nitride, silicon nitride oxide, aluminum nitride, aluminum nitride oxide, or the like. The hydrogen concentration of the insulating film 118 is preferably higher than or equal to $1\times10^{22}$ atoms/cm$^3$. Furthermore, the insulating film 118 is in contact with the third regions 110c of the oxide semiconductor film 110. Thus, hydrogen contained in the insulating film 118 is diffused to the third regions 110c of the oxide semiconductor film 110, whereby the hydrogen concentration of the third regions 110c is higher than that of the first region 110a functioning as the channel region in the oxide semiconductor film 110. The third regions 110c have higher hydrogen concentration than the second regions 110b functioning as the low-resistance regions. Thus, the conductivity of the third regions 110c is higher than that of the first region 110a and the second regions 110b.

<Insulating Film Functioning as Protective Insulating Film>

The insulating film 120 can be formed with a single layer or a stack using an oxide insulating film or a nitride insulating film. The insulating film 120 can be formed with a single layer or a stack using, for example, silicon oxide, silicon oxynitride, silicon nitride oxide, silicon nitride, aluminum oxide, hafnium oxide, gallium oxide, or a Ga—Zn oxide.

The insulating film 128 is preferably a film functioning as a barrier film against hydrogen, water, and the like from the outside. The insulating film 128 can be formed with a single layer or a stack using, for example, silicon nitride, silicon nitride oxide, aluminum oxide, or the like.

The thicknesses of the insulating film 118, the insulating film 120, and the insulating film 128 each can be greater than or equal to 30 nm and less than or equal to 500 nm, or greater than or equal to 100 nm and less than or equal to 400 nm.

<Structure 2 of Semiconductor Device>

Another structure of the semiconductor device illustrated in FIGS. 1A to 1C is described with reference to FIGS. 3A to 3C.

Figure 3A:
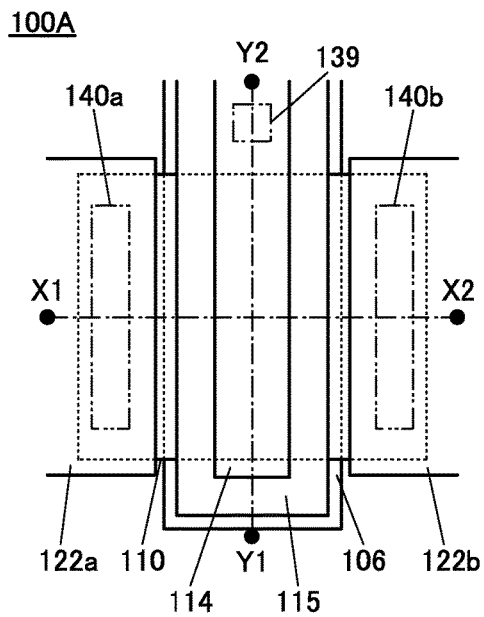
FIGS. 3A to 3C are a top view and cross-sectional views illustrating one mode of a semiconductor device.

FIG. 3A is a top view of a transistor 100A included in a semiconductor device. FIG. 3B is a cross-sectional view along the dashed-dotted line X1-X2 in FIG. 3A. FIG. 3C is a cross-sectional view along the dashed-dotted line Y1-Y2 in FIG. 3A.

Figure 3B:
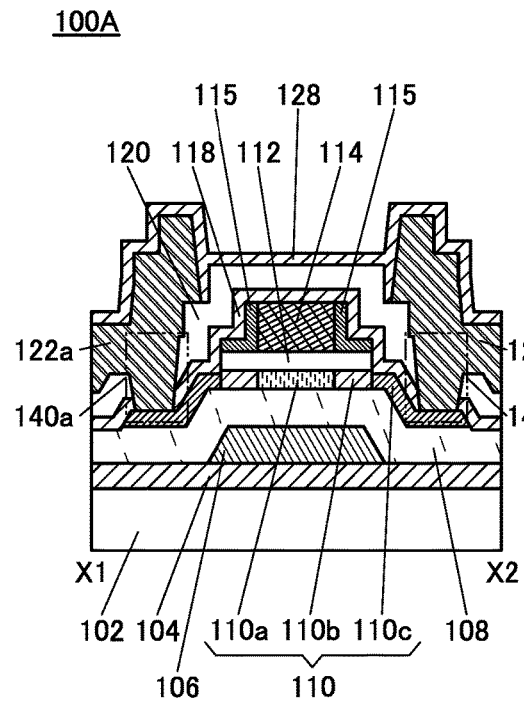
Figure 3C:
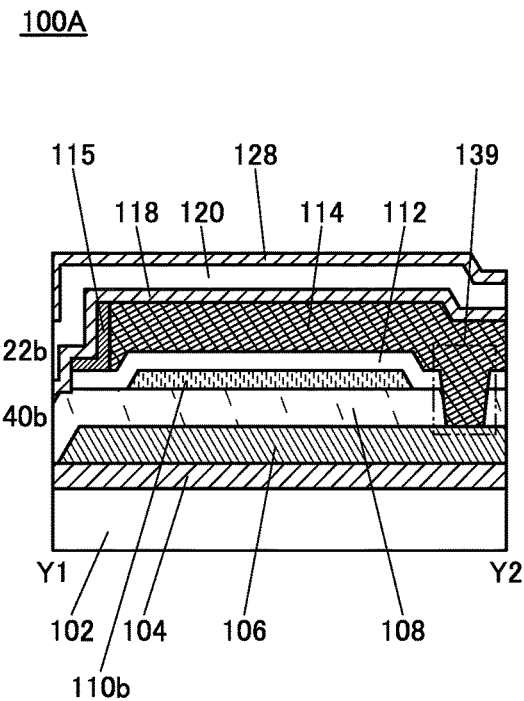

The transistor 100A illustrated in FIGS. 3A to 3C includes a conductive film 106 over the insulating film 104 formed over the substrate 102, the insulating film 108 (also referred to as a first insulating film) over the insulating film 104 and the conductive film 106, the oxide semiconductor film 110 overlapping with the conductive film 106 with the insulating film 108 provided therebetween, the insulating film 112 over the oxide semiconductor film 110, the conductive film 114 overlapping with the oxide semiconductor film 110 with the insulating film 112 provided therebetween, the conductive film 115 over the insulating film 112 and in contact with a side surface of the conductive film 114 at least in the channel length direction, and the insulating film 118 (also referred to as a second insulating film) over the oxide semiconductor film 110, the conductive film 114, and the conductive film 115. Furthermore, the oxide semiconductor film 110 has the first region 110a overlapping with the conductive film 114, the second regions 110b overlapping with the conductive film 115, and the third regions 110c in contact with the insulating film 118. Furthermore, the third regions 110c include regions having higher impurity element concentration than the second regions 110b.

The transistor 100A may include an insulating film 120 over the insulating film 118, a conductive film 122a electrically connected to the oxide semiconductor film 110 through an opening portion 140a provided in the insulating film 118 and the insulating film 120, and a conductive film 122b electrically connected to the oxide semiconductor film 110 through an opening portion 140b provided in the insulating film 118 and the insulating film 120. An insulating film 128 covering the insulating film 120 and the conductive films 122a and 122b may be provided over the transistor 100A.

The insulating film 104 functions as a base insulating film. Furthermore, the conductive film 106 functions as a first gate electrode (also referred to as a bottom-gate electrode), the insulating film 108 functions as a first gate insulating film, the conductive film 114 functions as a second gate electrode (also referred to as a top-gate electrode), the insulating film 112 functions as a second gate insulating film, the conductive film 122a functions as one of a source electrode and a drain electrode, and the conductive film 122b functions as the other of the source electrode and the drain electrode.

Note that the transistor 100A shown in FIGS. 3A to 3C is different from the transistor 100 described above and has a structure in which the conductive film functioning as a gate electrode is provided over and under the oxide semiconductor film 110. As in the transistor 100A, two or more gate electrodes may be provided in the semiconductor device of one embodiment of the present invention.

Furthermore, as illustrated in FIG. 3C, the conductive film 114 functioning as a second gate electrode is electrically connected to the conductive film 106 functioning as a first gate electrode through an opening portion 139 provided in the insulating film 108 and the insulating film 112. Therefore, the same potential is applied to the conductive film 114 and the conductive film 106. Note that the opening portion 139 is not necessarily provided, so that different potentials are supplied to the conductive film 114 and the conductive film 106.

Furthermore, as illustrated in FIG. 3C, the oxide semiconductor film 110 is positioned to face each of the conductive film 106 functioning as a first gate electrode and the conductive film 114 functioning as a second gate electrode, and is sandwiched between the two conductive films functioning as gate electrodes. The length in the channel width direction of the conductive film 114 functioning as a second gate electrode is longer than the length in the channel width direction of the oxide semiconductor film 110. In the channel width direction, the whole oxide semiconductor film 110 is covered with the conductive film 114 with the insulating film 112 provided therebetween. Since the conductive film 114 functioning as a second gate electrode is connected to the conductive film 106 functioning as a first gate electrode through the opening portion 139 provided in the insulating film 108 and the insulating film 112, a side surface of the oxide semiconductor film 110 in the channel width direction faces the conductive film 114 functioning as a second gate electrode with the insulating film 112 provided therebetween.

In other words, in the channel width direction of the transistor 100A, the conductive film 106 functioning as a first gate electrode and the conductive film 114 functioning as a second gate electrode are connected to each other through the opening portion provided in the insulating film 108 functioning as a first gate insulating film and the insulating film 112 functioning as a second gate insulating film; and the conductive film 106 and the conductive film 114 surround the oxide semiconductor film 110 with the insulating film 108 functioning as a first gate insulating film and the insulating film 112 functioning as a second gate insulating film provided therebetween.

Such a structure enables electric fields of the conductive film 106 functioning as a first gate electrode and the conductive film 114 functioning as a second gate electrode to electrically surround the oxide semiconductor film 110 included in the transistor 100A. A device structure of a transistor, like that of the transistor 100A, in which electric fields of a first gate electrode and a second gate electrode electrically surround an oxide semiconductor film where a channel region is formed can be referred to as a surrounded channel (s-channel) structure.

Since the transistor 100A has the s-channel structure, an electric field for inducing a channel can be effectively applied to the oxide semiconductor film 110 by the conductive film 106 functioning as a first gate electrode or the conductive film 114 functioning as a second gate electrode; therefore, the current drive capability of the transistor 100A can be improved and high on-state current characteristics can be obtained. Since the on-state current can be increased, it is possible to reduce the size of the transistor 100A. In addition, since the transistor 100A has a structure in which the oxide semiconductor film 110 is surrounded by the conductive film 106 functioning as a first gate electrode and the conductive film 114 functioning as a second gate electrode, the mechanical strength of the transistor 100A can be increased.

Note that in the channel width direction of the transistor 100A, an opening portion which is different from the opening portion 139 may be formed on the side of the oxide semiconductor film 110 where the opening portion 139 is not formed.

When a transistor has a pair of gate electrodes between which a semiconductor film is interposed as in the case of the transistor 100A, a signal A may be applied to one gate electrode and a fixed potential Vb may be applied to the other gate electrode. Alternatively, the signal A may be applied to one gate electrode and a signal B may be applied to the other gate electrode. Further alternatively, a fixed potential Va may be applied to one gate electrode and a fixed potential Vb may be applied to the other gate electrode.

The signal A is, for example, a signal for controlling a conduction state and a non-conduction state. The signal A may be a digital signal having two kinds of potentials, a potential V1 and a potential V2 (where V1>V2). For example, the potential V1 can be a high power supply potential and the potential V2 can be a low power supply potential. The signal A may be an analog signal.

The fixed potential Vb is, for example, a potential for controlling threshold voltage VthA of the transistor. The fixed potential Vb may be the potential V1 or the potential V2. In that case, no special potential generation circuit is needed. The fixed potential Vb may be a potential different from the potential V1 or the potential V2. In some cases, the threshold voltage VthA can be high by setting the fixed potential Vb low. As a result, drain current generated when gate-source voltage Vgs is 0 V can be reduced and leakage current in the circuit including the transistor can be reduced in some cases. For example, the fixed potential Vb may be set to be lower than the low power supply potential. On the other hand, in some cases, the threshold voltage VthA can be low by setting the fixed potential Vb high. As a result, drain current generated when the gate-source voltage Vgs is a high power supply potential can be increased and the operating speed of the circuit including the transistor can be improved in some cases. For example, the fixed potential Vb may be set to be higher than the low power supply potential.

The signal B is, for example, a signal for controlling a conduction state and a non-conduction state. The signal B may be a digital signal having two kinds of potentials, a potential V3 and a potential V4 (where V3>V4). For example, the potential V3 can be a high power supply potential and the potential V4 can be a low power supply potential. The signal B may be an analog signal.

When both the signal A and the signal B are digital signals, the signal B may be a signal having the same digital value as the signal A. In that case, the on-state current of the transistor and the operating speed of the circuit including the transistor can be sometimes increased. At that time, the potentials V1 and V2 of the signal A may be different from the potentials V3 and V4 of the signal B. For example, when the gate insulating film for the gate to which the signal B is input is thicker than the gate insulating film for the gate to which the signal A is input, the potential amplitude (V3-V4) of the signal B may be higher than that (V1-V2) of the signal A. In that case, sometimes the signal A and the signal B can equally affect a conduction state and a non-conduction state of the transistor.

When both the signal A and the signal B are digital signals, the signal B may be a signal having a digital value different from that of the signal A. In that case, sometimes the transistor can be controlled differently with the signal A and the signal B and thus, the transistor can have high functionality. For example, sometimes a NAND circuit, a NOR circuit, or the like can be formed using one transistor in the case where the transistor is an n-channel transistor and the transistor is brought into conduction only when the signal A has the potential V1 and the signal B has the potential V3 or the transistor is brought out of conduction only when the signal A has the potential V2 and the signal B has the potential V4. The signal B may be a signal for controlling the threshold voltage VthA. For example, the signal B may be a signal whose potential is different between a period when the circuit including the transistor operates and a period when the circuit does not operate. The signal B may be a signal whose potential is different between operation modes of the circuit. In that case, sometimes the potential of the signal B is not changed as often as the potential of the signal A.

When both the signal A and the signal B are analog signals, the signal B may be an analog signal having the same potential as the signal A; an analog signal whose potential is a constant times the potential of the signal A; an analog signal whose potential is the sum of the potential of the signal A and a constant potential; or an analog signal whose potential is the remainder of subtracting a constant potential from the potential of the signal A. In that case, the on-state current of the transistor and the operating speed of the circuit including the transistor can be sometimes increased. The signal B may be an analog signal that is different from the signal A. In that case, sometimes the transistor can be controlled differently with the signal A and the signal B and thus, the transistor can have high functionality.

The signal A may be a digital signal and the signal B may be an analog signal. Alternatively, the signal A may be an analog signal and the signal B may be a digital signal.

When fixed potentials are applied to the gate electrodes of the transistor, the transistor can function as an element equivalent to a resistor in some cases. For example, when the transistor is an n-channel transistor, the effective resistance of the transistor can be sometimes low (high) by making the fixed potential Va or the fixed potential Vb high (low). When both the fixed potential Va and the fixed potential Vb are high (low), the effective resistance can be lower (higher) than that of a transistor with only one gate in some cases.

The insulating film 104 can be formed using a material similar to that of the above-described insulating film 108. The conductive film 106 can be formed using a material similar to that of the above-described conductive film 114. Although a structure including the insulating film 104 is described as the transistor 100A, the structure is not limited thereto. For example, the insulating film 104 is not necessarily provided.

Note that the other components of the transistor 100A are similar to those of the transistor 100 described above, and an effect similar to that of the transistor 100 can be obtained.

<Structure 3 of Semiconductor Device>

Another structure of the semiconductor device illustrated in FIGS. 1A to 1C is described with reference to FIGS. 4A and 4B.

Figure 4A:
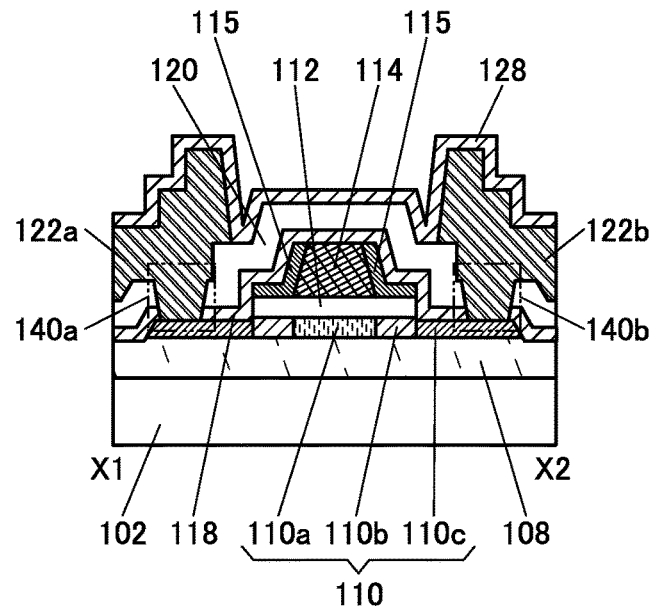
FIGS. 4A and 4B are cross-sectional views each illustrating one mode of a semiconductor device.
Figure 4B:
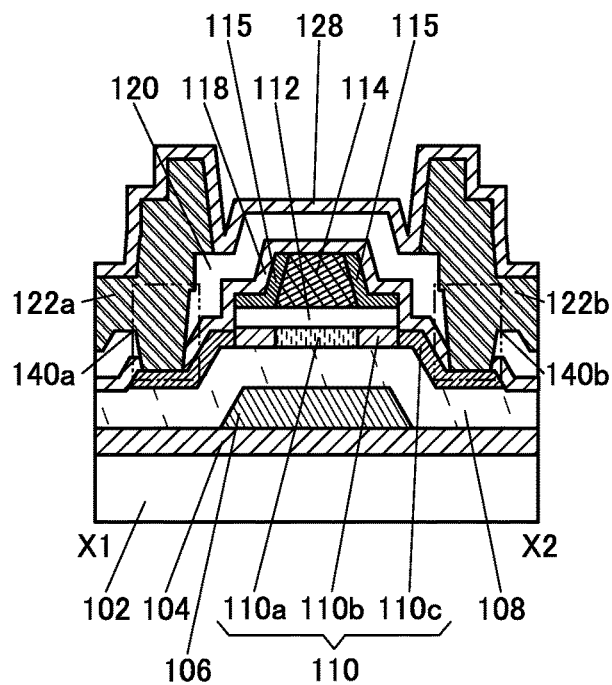

FIG. 4A is a cross-sectional view in the channel length direction of a transistor 100B of a semiconductor device, and FIG. 4B is a cross-sectional view in the channel length direction of a transistor 100C of a semiconductor device. Note that a top view and a cross-sectional view in the channel width direction of the transistor 100B illustrated in FIG. 4A are similar to the top view in FIG. 1A and the cross-sectional view in FIG. 1C, respectively. Note that a top view and a cross-sectional view in the channel width direction of the transistor 100C illustrated in FIG. 4B are similar to the top view in FIG. 3A and the cross-sectional view in FIG. 3C, respectively.

The transistor 100B is different from the above-described transistor 100 in the shape of the conductive film 114 functioning as a gate electrode. The transistor 100C is different from the above-described transistor 100A in the shape of the conductive film 114 functioning as a gate electrode.

As in the transistor 100B or 100C illustrated in FIG. 4A or 4B, the cross-sectional shape at least in the channel length direction of the conductive film 114 functioning as a gate electrode may be a tapered shape. Note that an angle formed between a surface where the insulating film 112 and the conductive film 114 are in contact with each other and a side surface of the conductive film 114 is preferably less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle has any of the above values, the coverage of the side surface of the conductive film 114 with the conductive film 115 and the coverage of the side surface of the conductive film 115 with the insulating film 118 can be increased.

<Structure 4 of Semiconductor Device>

Another structure of the semiconductor device illustrated in FIGS. 1A to 1C is described with reference to FIGS. 5A to 5C.

Figure 5A:
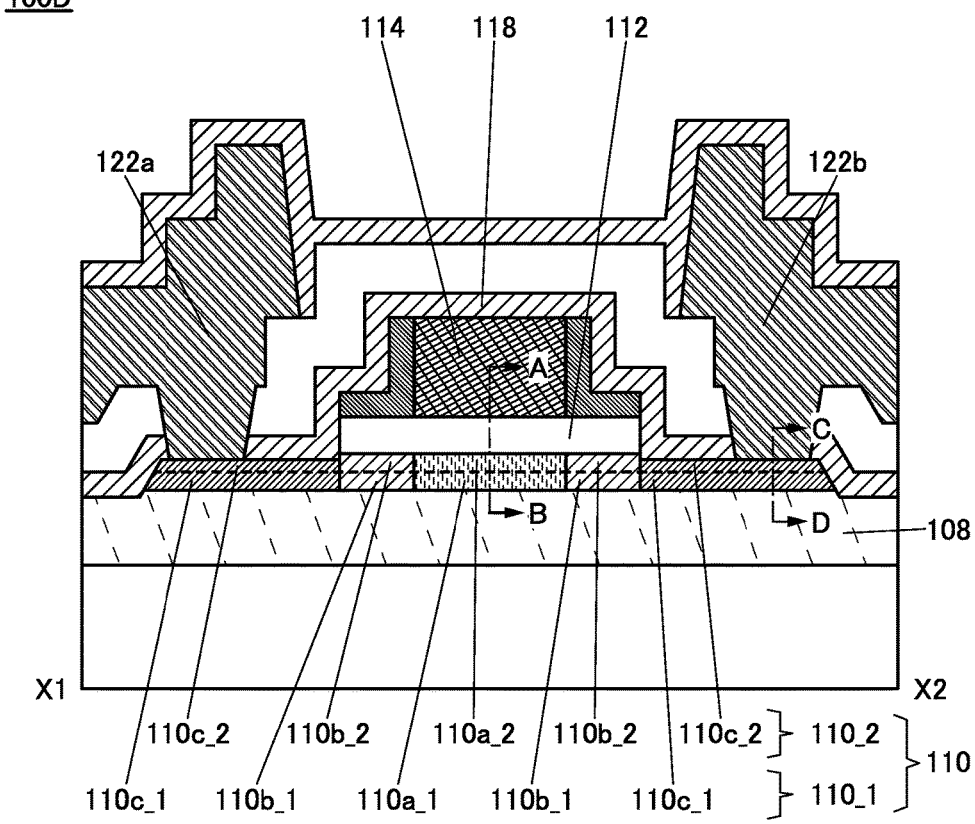
FIG. 5A is a cross-sectional view illustrating one mode of a semiconductor device and FIGS. 5B and 5C each illustrate one mode of a band structure.

A transistor 100D illustrated in FIG. 5A differs from the transistor 100 illustrated in FIGS. 1A to 1C in the structure of the oxide semiconductor film 110. Specifically, the oxide semiconductor film 110 included in the transistor 100D includes an oxide semiconductor film 110_1 and an oxide semiconductor film 110_2 provided in contact with the oxide semiconductor film 110_1. That is, the oxide semiconductor film 110 has a multilayer structure.

The oxide semiconductor film 110_1 includes a first region 110a_1, second regions 110b_1, and third regions 110c_1. The oxide semiconductor film 110_2 includes a first region 110a_2, second regions 110b_2, and third regions 110c_2.

<Band Structure>

Figure 5B:
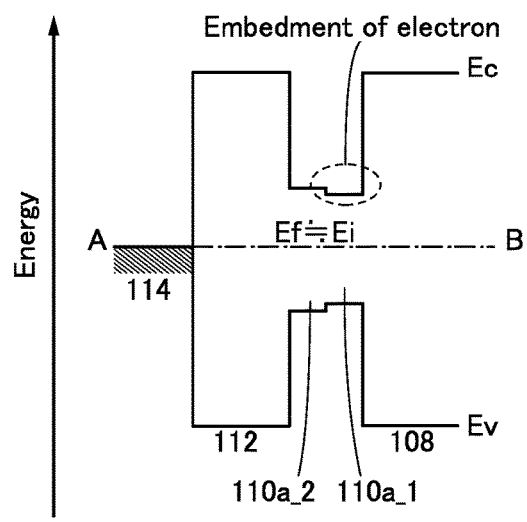

Here, a band structure in the A-B cross section including the channel regions of the transistor 100D is illustrated in FIG. 5B. Note that the oxide semiconductor film 110_2 is assumed to have a wider energy gap than the oxide semiconductor film 110_1. Furthermore, the insulating film 108 and the insulating film 112 are assumed to have wider energy gaps than the oxide semiconductor film 110_1 and the oxide semiconductor film 110_2. Furthermore, the Fermi levels (denoted by Ef) of the oxide semiconductor film 110_1, the oxide semiconductor film 110_2, the insulating film 108, and the insulating film 112 are assumed to be equal to the intrinsic Fermi levels thereof (denoted by Ei). Furthermore, a work function of the conductive film 114 is assumed to be equal to the Fermi levels.

When a gate voltage is set to be higher than or equal to the threshold voltage of the transistor, an electron flows preferentially in the oxide semiconductor film 110_1 owing to the difference between the energies of the conduction band minimums of the oxide semiconductor film 110_1 and the oxide semiconductor film 110_2. That is, it is probable that an electron is embedded in the oxide semiconductor film 110_1. Note that the energy at the conduction band minimum is denoted by Ec, and the energy at the valence band maximum is denoted by Ev.

Accordingly, in the transistor according to one embodiment of the present invention, the embodiment of an electron reduces the influence of interface scattering. Therefore, the channel resistance of the transistor according to one embodiment of the present invention is low.

Figure 5C:
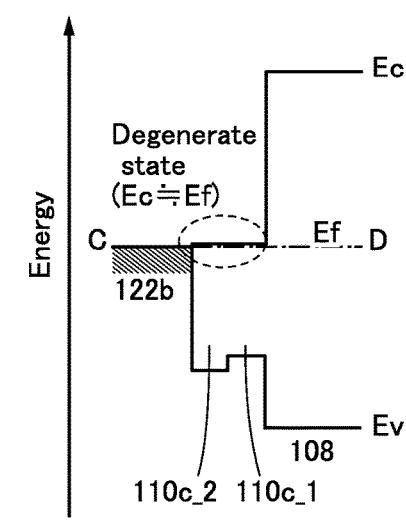

Next, FIG. 5C shows a band structure in the C-D cross section including the source region or the drain region of the transistor 100D. Note that the third region 110c_1 and the third region 110c_2 are assumed to be in a degenerate state. Furthermore, the Fermi level of the oxide semiconductor film 110_1 is assumed to be approximately the same as the energy of the conduction band minimum in the third region 110c_1. Furthermore, the Fermi level of the oxide semiconductor film 110_2 is assumed to be approximately the same as the energy of the conduction band minimum in the third region 110c_2.

At this time, an ohmic contact is made between the conductive film 122b functioning as a source electrode or a drain electrode and the third region 110c_2 because an energy barrier therebetween is sufficiently low. Furthermore, an ohmic contact is made between the third region 110c_2 and the third region 110c_1. Therefore, electron transfer is conducted smoothly between the conductive film 122b and the oxide semiconductor films 110_1 and 110_2.

Note that description similar to that of FIG. 5C can be made on a region where the conductive film 122a functioning as one of a source electrode and a drain electrode of the transistor 100D is in contact with the second region 110b_1 and the second region 110b_2 of the oxide semiconductor film 110.

As described above, the transistor according to one embodiment of the present invention is a transistor in which the channel resistance is low and electron transfer between the channel region and the source and the drain electrodes is conducted smoothly. That is, the transistor has excellent switching characteristics.

<Method 1 for Manufacturing Semiconductor Device>

Next, an example of a method for manufacturing the transistor 100 illustrated in FIGS. 1A to 1C is described with reference to FIGS. 6A to 6D, FIGS. 7A to 7C, FIGS. 8A to 8D, FIGS. 9A to 9D, and FIGS. 10A to 10C. Note that FIGS. 6A to 6D, FIGS. 7A to 7C, FIGS. 8A to 8D, FIGS. 9A to 9D, and FIGS. 10A to 10C are cross-sectional views in the channel length direction illustrating a method for manufacturing the transistor 100.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then, the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

Figure 6A:
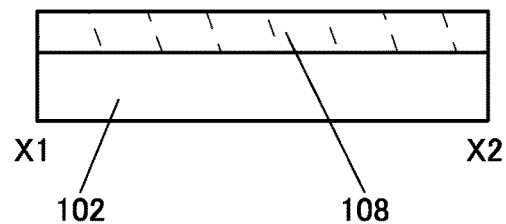
FIGS. 6A to 6D are cross-sectional views illustrating an example of a manufacturing process of a semiconductor device.

First, the insulating film 108 is formed over the substrate 102 (see FIG. 6A).

The insulating film 108 can be formed by a sputtering method, a CVD method, an evaporation method, a pulsed laser deposition (PLD) method, a printing method, a coating method, or the like as appropriate. In this embodiment, as the insulating film 108, a 100-nm-thick silicon nitride film and a 400-nm-thick silicon oxynitride film are formed using a PECVD apparatus.

After the insulating film 108 is formed, oxygen may be added to the insulating film 108. Examples of oxygen added to the insulating film 108 include an oxygen radical, an oxygen atom, an oxygen atomic ion, and an oxygen molecular ion. As a method for adding the oxygen, an ion doping method, an ion implantation method, plasma treatment, or the like can be given. Alternatively, after a film that suppresses release of oxygen is formed over the insulating film, oxygen may be added to the insulating film 108 through the film.

Alternatively, as the insulating film 108, a silicon oxide film or a silicon oxynitride film that can release oxygen by heat treatment can be formed under the following conditions: the substrate placed in a treatment chamber of the PECVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

Here, a method in which a film that suppresses release of oxygen is formed over the insulating film 108 and then oxygen is added to the insulating film 108 through the film is described.

Figure 6B:
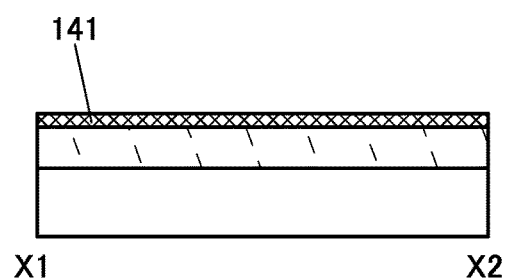

First, a film 141 that suppresses release of oxygen is formed over the insulating film 108 (see FIG. 6B).

Figure 6C:
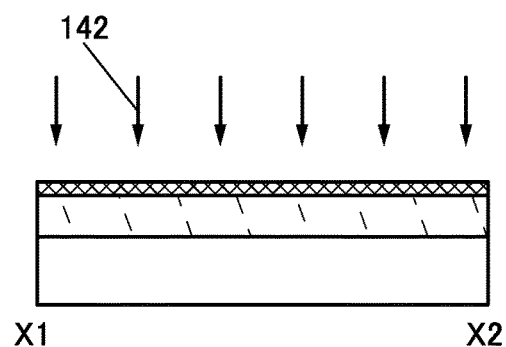

Next, oxygen 142 is added to the insulating film 108 through the film 141 (see FIG. 6C).

The film 141 that suppresses release of oxygen is formed using any of the following conductive materials: a metal element selected from indium, zinc, gallium, tin, aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the film 141 that suppresses release of oxygen can be greater than or equal to 1 nm and less than or equal to 20 nm, or greater than or equal to 2 nm and less than or equal to 10 nm.

As a method for adding the oxygen 142 to the insulating film 108 through the film 141, an ion doping method, an ion implantation method, plasma treatment, or the like is given. By adding oxygen to the insulating film 108 with the film 141 provided over the insulating film 108, the film 141 functions as a protective film that suppresses release of oxygen from the insulating film 108. Thus, more oxygen can be added to the insulating film 108.

In the case where oxygen is added by plasma treatment, by making oxygen excited by a microwave to generate high density oxygen plasma, the amount of oxygen added to the insulating film 108 can be increased.

Figure 6D:
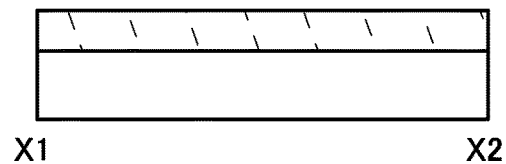

Then, the film 141 is removed (see FIG. 6D).

Note that the film 141 is removed by a wet etching method and/or a dry etching method, for example. Note that the treatment for adding oxygen which is illustrated in FIGS. 6B and 6C is not necessarily performed in the case where the insulating film 108 to which a sufficient amount of oxygen is added can be formed after its deposition.

Next, an oxide semiconductor film is formed over the insulating film 108, and the oxide semiconductor film is processed into a desired shape, whereby the oxide semiconductor film 110 is formed. After that, the insulating film 112 is formed over the insulating film 108 and the oxide semiconductor film 110 (see FIG. 7A).

Figure 7A:
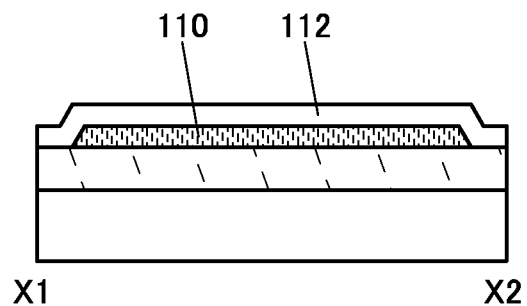
FIGS. 7A to 7C are cross-sectional views illustrating an example of a manufacturing process of a semiconductor device.

A formation method of the oxide semiconductor film 110 is described below. An oxide semiconductor film is formed over the insulating film 108 by a sputtering method, a coating method, a pulsed laser deposition method, a laser ablation method, a thermal CVD method, or the like. Then, after a mask is formed over the oxide semiconductor film by a lithography step, the oxide semiconductor film is partly etched using the mask. Accordingly, the oxide semiconductor film 110 can be formed as illustrated in FIG. 7A. After that, the mask is removed. Note that heat treatment may be performed after the oxide semiconductor film 110 is formed.

Alternatively, by using a printing method for forming the oxide semiconductor film 110, the oxide semiconductor film 110 subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

In the case where the oxide semiconductor film is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

Furthermore, in the case where the oxide semiconductor film is formed by a sputtering method, a sputtering target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., higher than or equal to 150° C. and lower than or equal to 450° C., or higher than or equal to 200° C. and lower than or equal to 350° C., a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, or −100° C. or lower is used.

Furthermore, it is preferable that the proportion of oxygen in the deposition gas be increased and the power be optimized in order to reduce plasma damage at the deposition. The proportion of oxygen in the deposition gas is 30 vol % or higher, or 100 vol %.

After the oxide semiconductor film is formed, heat treatment may be performed so that the oxide semiconductor film is subjected to dehydrogenation or dehydration. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Furthermore, the heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration in the oxide semiconductor film, which is measured by secondary ion mass spectrometry, can be $5 \times 10^{19}$ atoms/cm$^3$ or lower, $1 \times 10^{19}$ atoms/cm$^3$ or lower, $5 \times 10^{18}$ atoms/cm$^3$ or lower, $1 \times 10^{18}$ atoms/cm$^3$ or lower, $5 \times 10^{17}$ atoms/cm$^3$ or lower, or $1 \times 10^{16}$ atoms/cm$^3$ or lower.

For example, in the case where an oxide semiconductor film, e.g., an InGaZnO$_x$ (X>0) film is formed using a deposition apparatus employing ALD, an In(CH$_3$)$_3$ gas and an O$_3$ gas are sequentially introduced more than once to form an InO$_2$ layer, a Ga(CH$_3$)$_3$ gas and an O$_3$ gas are sequentially introduced more than once to form a GaO layer, and then a Zn(CH$_3$)$_2$ gas and an O$_3$ gas are sequentially introduced more than once to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, a Zn(CH$_3$)$_2$ gas may be used.

Note that in this embodiment, the oxide semiconductor film 110 is formed as follows. A 50-nm-thick oxide semiconductor film is deposited using a sputtering apparatus and using an In—Ga—Zn metal oxide (In:Ga:Zn=1:1:1.2 [atomic ratio]) as a sputtering target, and then, heat treatment is performed, whereby oxygen contained in the insulating film 108 is moved to the oxide semiconductor film. Next, a mask is formed over the oxide semiconductor film, and part of the oxide semiconductor film is selectively etched. Thus, the oxide semiconductor film 110 is formed.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC, which is described later, is greater than or equal to 60% and less than 100%, greater than or equal to 80% and less than 100%, greater than or equal to 90% and less than 100%, or greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

The insulating film 112 can be formed by the formation method of the insulating film 108 as appropriate. As the insulating film 112, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

The silicon oxynitride film having a small amount of defects can be formed as the insulating film 112 by a PECVD method under the conditions where the ratio of an oxidizing gas to a deposition gas is higher than 20 times and lower than 100 times or higher than or equal to 40 times and lower than or equal to 80 times and the pressure in a treatment chamber is lower than 100 Pa or lower than or equal to 50 Pa.

As the insulating film 112, a silicon oxide film or a silicon oxynitride film which is dense can be formed under the following conditions: the substrate placed in a treatment chamber of a PECVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating film 112 can be formed by a plasma CVD method using a microwave. The microwave refers to a wave in the frequency range of 300 MHz to 300 GHz. In a microwave, electron temperature is low and electron energy is low. Furthermore, in supplied power, the proportion of power used for acceleration of electrons is low, and therefore, much more power can be used for dissociation and ionization of molecules. Thus, plasma with high density (high-density plasma) can be excited. Therefore, a deposition surface and a deposit are less damaged by plasma, and the insulating film 112 with few defects can be formed.

Alternatively, the insulating film 112 can be formed by a CVD method using an organosilane gas. As the organosilane gas, any of the following silicon-containing compounds can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); and the like. By a CVD method using the organosilane gas, the insulating film 112 having high coverage can be formed.

In the case where a gallium oxide film is formed as the insulating film 112, metal organic chemical vapor deposition (MOCVD) can be used.

In the case where a hafnium oxide film is formed as the insulating film 112 by a thermal CVD method such as an MOCVD method or an ALD method, two kinds of gases, i.e., ozone ($O_3$) as an oxidizer and a source gas which is obtained by vaporizing a liquid containing a solvent and a hafnium precursor compound (hafnium alkoxide or hafnium amide such as tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the insulating film 112 by a thermal CVD method such as an MOCVD method or an ALD method, two kinds of gases, i.e., $H_2O$ as an oxidizer and a source gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate). Note that the ALD method enables the insulating film 112 to have excellent coverage and small thickness.

In the case where a silicon oxide film is formed as the insulating film 112 by a thermal CVD method such as an MOCVD method or an ALD method, hexachlorodisilane is adsorbed on a deposition surface, chlorine contained in adsorbate is removed, and radicals of an oxidizing gas (e.g., $O_2$ or dinitrogen monoxide) are supplied to react with the adsorbate.

Here, a 100-nm-thick silicon oxynitride film is formed using a PECVD apparatus as the insulating film 112.

Figure 7B:
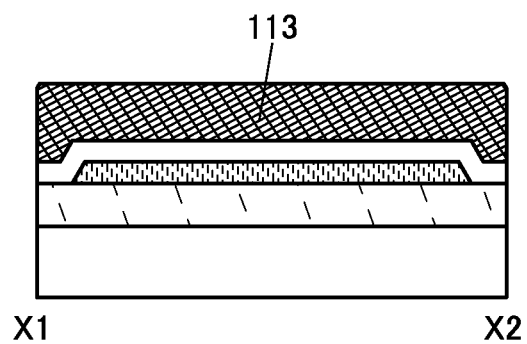

Next, a conductive film 113 is formed over the insulating film 112 (see FIG. 7B).

The conductive film 113 can be formed by a sputtering method, a vacuum evaporation method, a pulsed laser deposition (PLD) method, a thermal CVD method, or the like. In this embodiment, a 400-nm-thick tungsten film is formed using a sputtering apparatus as the conductive film 113.

Alternatively, a tungsten film can be formed as the conductive film 113 with a deposition apparatus employing an ALD method. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 7C:
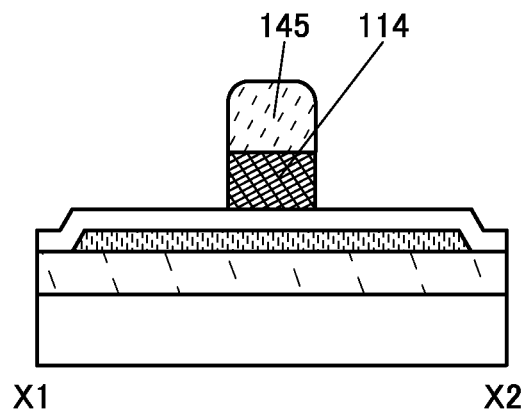

Next, a mask 145 is formed over the conductive film 113 by a lithography step, and then, the conductive film 113 is partly etched, whereby the conductive film 114 is formed (see FIG. 7C).

As a method for etching the conductive film 113, a wet etching method and/or a dry etching method can be used as appropriate. Here, the conductive film 113 is processed into the conductive film 114 by a dry etching method.

Figure 8A:
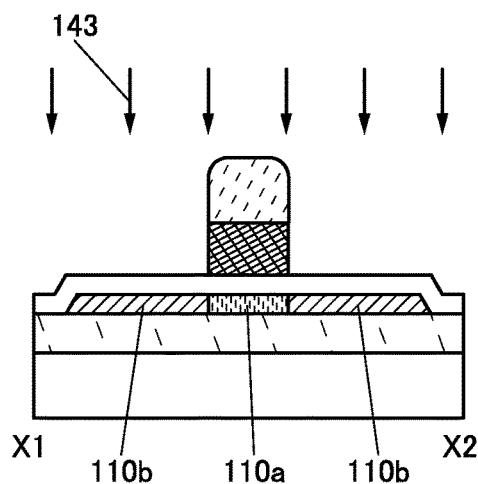
FIGS. 8A to 8D are cross-sectional views illustrating an example of a manufacturing process of a semiconductor device.

Then, an impurity element 143 is added from above the insulating film 112 and the mask 145, so that the first region 110a and the second regions 110b are formed in the oxide semiconductor film 110 (see FIG. 8A).

Note that in the step of adding the impurity element 143, the impurity element 143 is added through the insulating film 112 to the oxide semiconductor film 110 in a region not overlapping with the conductive film 114 and the mask 145, and the regions of the oxide semiconductor film 110 to which the impurity element 143 is added become the second regions 110b. The region of the oxide semiconductor film 110 to which the impurity element 143 is not added becomes the first region 110a. Oxygen vacancies are formed in the second regions 110b to which the impurity element 143 is added.

As a method for adding the impurity element 143, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, an ashing apparatus, a plasma CVD apparatus, a high-density plasma CVD apparatus, or the like can be used to generate the plasma.

Note that as a source gas of the impurity element 143, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By adding the impurity element 143 to the oxide semiconductor film 110 using one or more of $B_2H_6$, $PH_3$, $N_2$, $NH_3$, $AlH_3$, $AlCl_3$, $F_2$, HF, and $H_2$ which are diluted with a rare gas, one or more of the rare gas, hydrogen, boron, carbon, nitrogen, fluorine, phosphorus, sulfur, and chlorine can be added to the oxide semiconductor film 110.

Alternatively, after a rare gas is added to the oxide semiconductor film 110, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor film 110.

Alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the oxide semiconductor film 110, a rare gas may be added to the oxide semiconductor film 110.

The addition of the impurity element 143 is controlled by appropriately setting the implantation conditions such as the acceleration voltage and the dose. For example, in the case where argon is added by an ion implantation method, the acceleration voltage may be set to be higher than or equal to 10 kV and lower than or equal to 100 kV and the dose may be set to greater than or equal to $1\times10^{13}$ ions/cm$^2$ and less than or equal to $1\times10^{16}$ ions/cm$^2$, e.g., $1\times10^{14}$ ions/cm$^2$. In the case where a phosphorus ion is added by an ion implantation method, the acceleration voltage is set to 30 kV and the dose is set to greater than or equal to $1\times10^{13}$ ions/cm$^2$ and less than or equal to $5\times10^{16}$ ions/cm$^2$, e.g., $1\times10^{15}$ ions/cm$^2$.

In the case where argon is added as the impurity element 143 using a dry etching apparatus, the substrate may be set to a parallel plate on the cathode side and an RF power may be supplied so that a bias is applied to the substrate side. As the RF power, for example, power density can be greater than or equal to 0.1 W/cm$^2$ and less than or equal to 2 W/cm$^2$.

It is preferable that the impurity element 143 be added in a state where the mask 145 is left as in this embodiment. By the addition of the impurity element 143 in a state where the mask 145 is left, adhesion of a constituent element of the conductive film 114 to the insulating film 112 can be suppressed. However, a method for adding the impurity element 143 is not limited thereto; for example, the impurity element 143 may be added using the conductive film 114 as a mask after the mask 145 is removed.

In this embodiment, hydrogen is added to the oxide semiconductor film 110 as the impurity element 143 using a doping apparatus.

After the addition of the impurity element 143, heat treatment may be performed to further increase the conductivity of the second regions 110b of the oxide semiconductor film 110 to which the impurity element 143 is added. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Figure 8B:
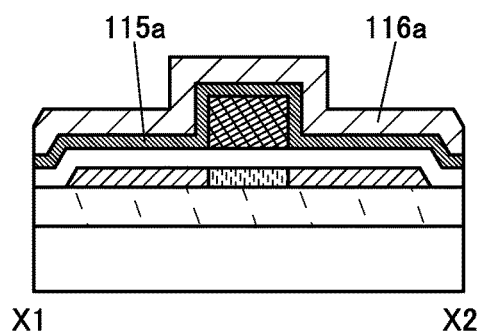

Then, the mask 145 is removed and a conductive film 115a and an insulating film 116a are formed over the insulating film 112 and the conductive film 114 (see FIG. 8B).

The conductive film 115a can be formed using the material that can be used for the conductive film 115. In this embodiment, a 50-nm-thick ITSO film is formed using a sputtering apparatus as the conductive film 115a.

The insulating film 116a can be formed using the material that can be used for the insulating film 108 or the insulating film 112. In this embodiment, a 400-nm-thick silicon oxynitride film is formed using a PECVD apparatus as the insulating film 116a. Note that the insulating film 116a is preferably formed using a material of the same kind as the material for the insulating film 112 because the insulating film 116a can be processed in the same step as the insulating film 112.

Figure 8C:
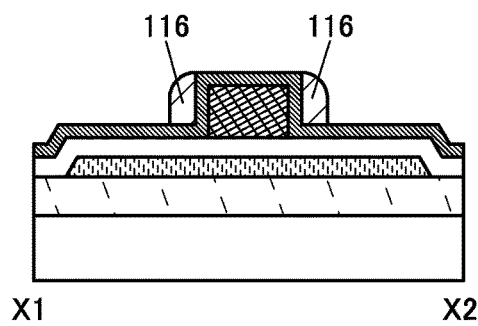

Next, the insulating film 116a is processed to form an insulating film 116 that functions as a sidewall insulating film on a side wall of the conductive film 115a located on a side wall of the conductive film 114 (see FIG. 8C).

The insulating film 116 is preferably processed through anisotropic etching using a dry etching apparatus. When the insulating film 116a is processed into the insulating film 116, the conductive film 115a is partly exposed. Note that although the insulating film 116 is shown as being divided in a cross-sectional view in the channel length direction, the insulating film 116 is continuous in a cross-sectional view in the channel width direction and is one island.

Figure 8D:
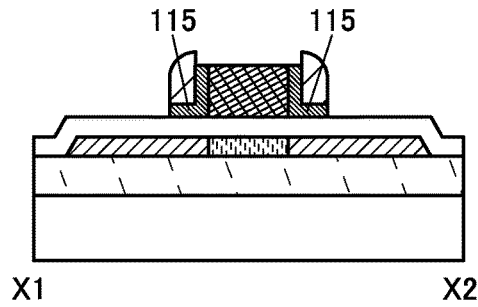

Then, the conductive film 115a is processed with the insulating film 116 used as a mask, so that a conductive film 115 is formed (see FIG. 8D).

As a method for processing the conductive film 115a, a wet etching method and/or a dry etching method can be used as appropriate. In this embodiment, the conductive film 115a is processed by a wet etching method. Note that through the formation of the conductive film 115, the conductive film 115a in the region which is not covered with the insulating film 116 is removed.

Next, the insulating film 112 is processed using the conductive film 114 and the conductive film 115 as masks, so that the insulating film 112 having an island-like shape is formed. Note that when the insulating film 112 is processed into an island-like shape, the insulating film 116 is removed (see FIG. 9A).

As a method for processing the insulating film 112, a wet etching method and/or a dry etching method can be used as appropriate. In this embodiment, the insulating film 112 is processed into an island-like shape by a dry etching method. Note that the oxide semiconductor film 110 is at least partly exposed in a step of processing the insulating film 112. Note that a region where part of the oxide semiconductor film 110 is exposed has a smaller thickness than the oxide semiconductor film 110 overlapping with the conductive film 114 and the conductive film 115 by a step of processing the insulating film 112, in some cases. Furthermore, a region of the insulating film 108 functioning as a base film which is exposed from the oxide semiconductor film 110 is partly removed in a step of processing the insulating film 112, and thus, the thickness of the region is smaller than that of a region overlapping with the oxide semiconductor film 110 in some cases.

Although an example of a structure in which the insulating film 116 is removed is described in this embodiment, one embodiment of the present invention is not limited thereto. For example, the insulating film 116 may remain over the conductive film 115.

In some cases, a cross-sectional shape corresponding to that of the conductive film 114 and the conductive film 115 can be obtained when the conductive film 113 is a stacked-layer film and processed into a staircase-like shape. However, to obtain a uniform shape over a substrate, the above-described process is preferably employed in which the conductive film 115 is formed on a side wall of the conductive film 114 at least in the channel length direction.

Figure 9A:
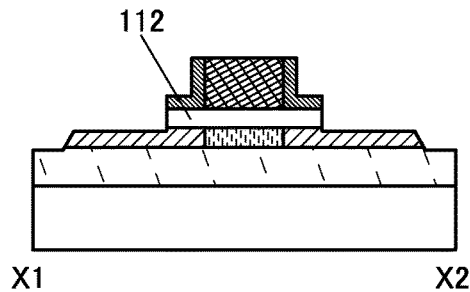
FIGS. 9A to 9D are cross-sectional views illustrating an example of a manufacturing process of a semiconductor device.
Figure 9B:
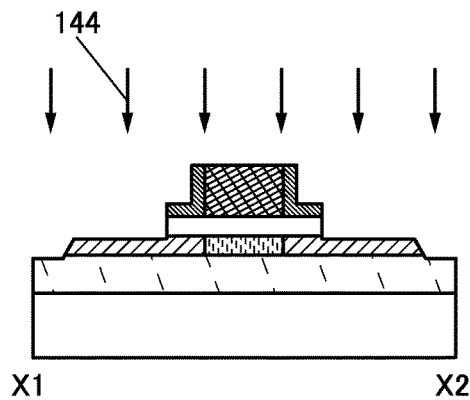
Figure 9C:
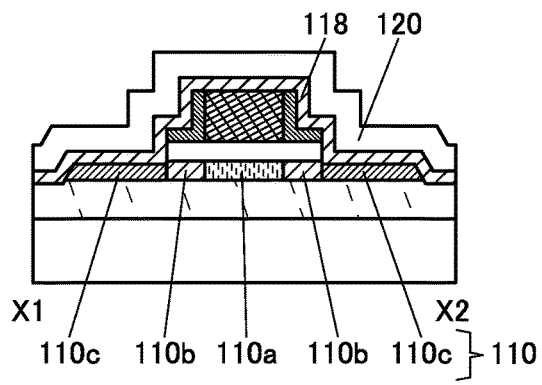

Then, an impurity element 144 is added to the oxide semiconductor film 110 (see FIG. 9B).

The impurity element 144 can be added using a material and a method similar to those used for the impurity element 143. In this embodiment, an argon gas is added to the oxide semiconductor film 110 as the impurity element 144 using a dry etching apparatus. The impurity element 144 is added to the regions of the oxide semiconductor film 110 not overlapping with the conductive film 114 and the conductive film 115, specifically, part of the second regions 110b. Note that although the step of adding the impurity element 144 is described in this embodiment, one embodiment of the present invention is not limited to this example, and the step of adding the impurity element 144 is not necessarily performed.

Next, the insulating films 118 and 120 are formed over the insulating film 108, the oxide semiconductor film 110, the conductive film 114, and the conductive film 115. Note that at the stage of forming the insulating film 118, the first region 110a, the second regions 110b, and the third regions 110c are formed in a self-aligned manner in the oxide semiconductor film 110 (see FIG. 9C).

The insulating film 118 can be formed using the material that can be used for the insulating film 118. In this embodiment, a 100-nm-thick silicon nitride film is formed using a PECVD apparatus as the insulating film 118. The insulating film 120 can be formed using the material that can be used for the insulating film 120. In this embodiment, a 300-nm-thick silicon oxynitride film is formed using a PECVD apparatus as the insulating film 118.

When the insulating film 118 is formed of a silicon nitride film, hydrogen in the silicon nitride film enters the oxide semiconductor film 110 in contact with the insulating film 118, specifically, part of the second regions 110b, so that the concentration of carriers in the second regions 110b is further increased and the third regions 110c are formed. That is, the third regions 110c having higher conductivity than the first region 110a and the second regions 110b can be formed.

Figure 9D:
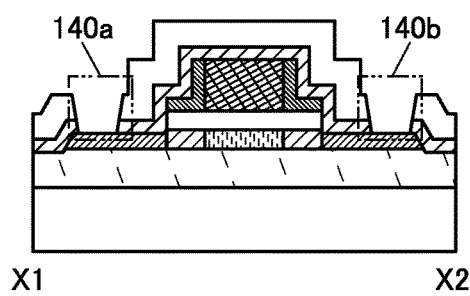

Next, a mask is formed over the insulating film 120 by a lithography step, and then, the insulating film 120 and the insulating film 118 are partly etched, whereby the opening portions 140a and 140b that reach the third regions 110c in the oxide semiconductor film 110 are formed (see FIG. 9D).

As a method for etching the insulating film 120 and the insulating film 118, a wet etching method and/or a dry etching method can be used as appropriate. In this embodiment, the insulating films 118 and 120 are processed by a dry etching method.

Figure 10A:
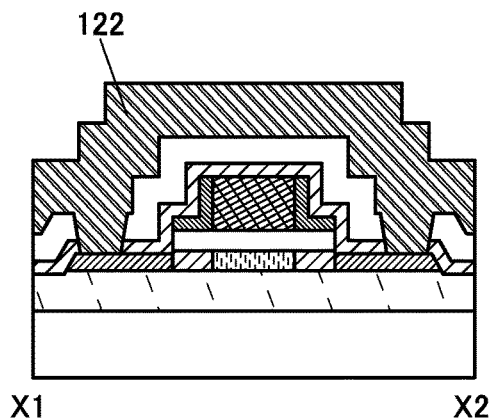
FIGS. 10A to 10C are cross-sectional views illustrating an example of a manufacturing process of a semiconductor device.

Then, a conductive film 122 is formed over the insulating film 120 to cover the opening portions 140a and 140b (see FIG. 10A).

The conductive film 122 can be formed using the material that can be used for the conductive films 122a and 122b. In this embodiment, a stacked-layer film including a 50-nm-thick tungsten film and a 200-nm-thick copper film is formed using a sputtering apparatus as the conductive film 122.

Figure 10B:
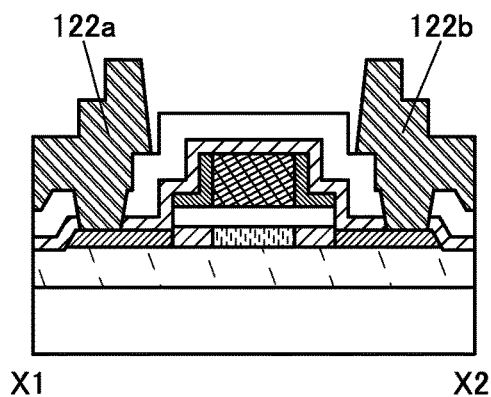

Next, a mask is formed over the conductive film 122 by a lithography step, and then, the conductive film 122 is partly etched, whereby the conductive films 122a and 122b are formed (see FIG. 10B).

As a method for processing the conductive film 122, a wet etching method and/or a dry etching method can be used as appropriate. In this embodiment, the conductive film 122 is processed by a dry etching method to form the conductive films 122a and 122b.

Figure 10C:
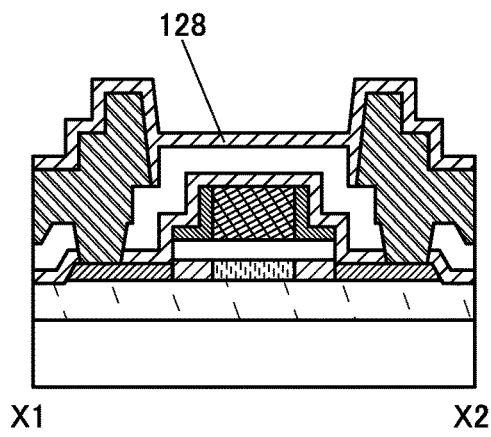

Next, the insulating film 128 is formed over the insulating film 120 and the conductive films 122a and 122b (see FIG. 10C).

The insulating film 128 can be formed using the material that can be used for the insulating film 128. In this embodiment, a 200-nm-thick silicon nitride film is formed using a PECVD apparatus as the insulating film 128.

Through the above-described steps, the transistor 100 illustrated in FIGS. 1A to 1C can be manufactured.

<Method 2 for Manufacturing Semiconductor Device>

Next, an example of a method for manufacturing the transistor 100A in FIGS. 3A to 3C is described below.

First, the insulating film 104 is formed over the substrate 102. Next, a conductive film is formed over the insulating film 104, and the conductive film is processed into a desired shape, whereby the conductive film 106 is formed. A 100-nm-thick silicon nitride film is formed using a PECVD apparatus as the insulating film 104. A 200-nm-thick tungsten film is formed using a sputtering apparatus as the conductive film 106. Next, steps similar to those illustrated in FIGS. 6A to 6D and FIG. 7A are performed. After that, a mask is formed over the insulating film 112 by a lithography step, and then, the insulating film 112 is partly etched, whereby the opening portion 139 that reaches the conductive film 106 is formed. The subsequent steps can be performed in manners similar to those of the steps illustrated in FIG. 7B and subsequent figures. Thus, the transistor 100A illustrated in FIGS. 3A to 3C can be manufactured.

Although an example in which the transistor includes the oxide semiconductor film is shown in this embodiment, one embodiment of the present invention is not limited thereto. In one embodiment of the present invention, the transistor does not necessarily include the oxide semiconductor film. For example, the channel region, the vicinity of the channel region, the source region, or the drain region of the transistor may be formed using a material containing Si (silicon), Ge (germanium), SiGe (silicon germanium), GaAs (gallium arsenide), or the like.

The structure and method described in this embodiment can be combined as appropriate with any of the other structures and methods described in the other embodiments.

(Embodiment 2)

In this embodiment, the structure of an oxide semiconductor film included in a semiconductor device of one embodiment of the present invention will be described in detail below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, a boundary between crystal parts, that is, a grain boundary is not clearly observed even in the high-resolution TEM image. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology that reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. In addition, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might function as a carrier trap or a carrier generation source.

The CAAC-OS film is an oxide semiconductor film having a low density of defect states. In some cases, oxygen vacancies in the oxide semiconductor film function as carrier traps or function as carrier generation sources when hydrogen is captured therein.

The state in which the impurity concentration is low and the density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having a high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, bright regions in a circular (ring) pattern are observed in some cases. Moreover, in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film whose density is lower than 78% of the density of the single crystal oxide semiconductor film.

Specific examples of the above description are given. For example, in the case of an oxide semiconductor film having an atomic ratio of In:Ga:Zn=1:1:1, the density of single-crystal InGaZnO$_4$ with a rhombohedral crystal structure is 6.357 g/cm$^3$.

Thus, for example, in the case of the oxide semiconductor film having an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film having an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked-layer film including two or more films of an amorphous oxide semiconductor film, an a-like OS film, a microcrystalline oxide semiconductor film, and a CAAC-OS film, for example.

The structure described in this embodiment can be used in appropriate combination with the structure described in any of the other embodiments.

(Embodiment 3)

In this embodiment, an example of a display device that includes any of the transistors described in the above embodiments is described below with reference to FIG. 11, FIG. 12, and FIG. 13.

Figure 11:
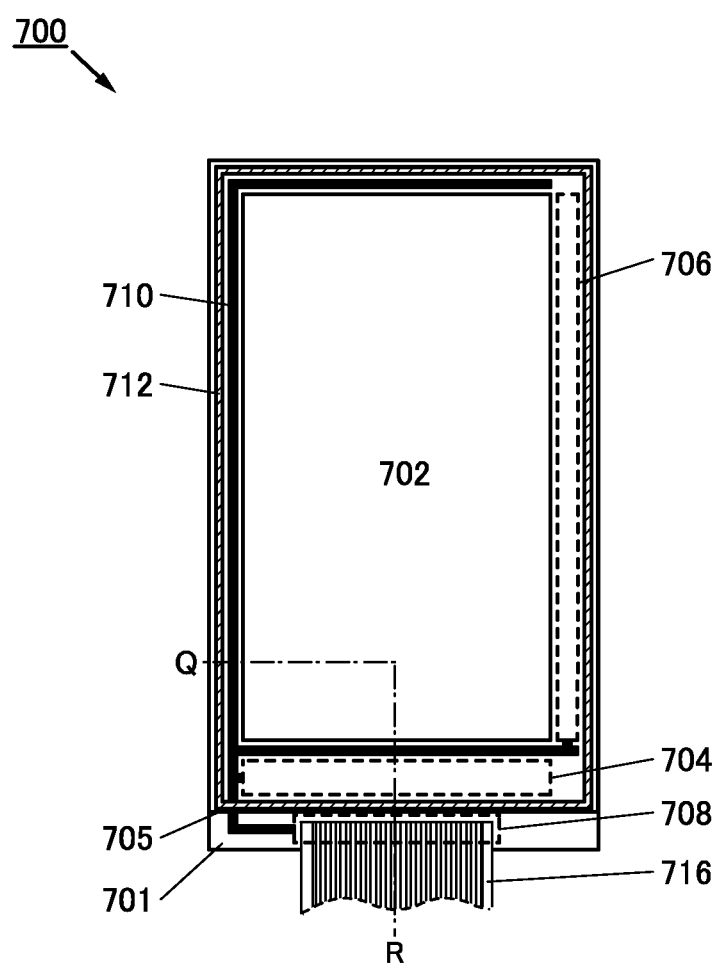
FIG. 11 is a top view illustrating one mode of a display device.

FIG. 11 is a top view of an example of a display device. A display device 700 illustrated in FIG. 11 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 11, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Other than the above, the element may include a display medium whose contrast, luminance, reflectivity, transmittance, or the like is changed by electrical or magnetic effect. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors of R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. The size of a display region may be different between respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring method, any of the following methods may be used: the above-described color filter method in which part of white light emission is converted into red light, green light, and blue light through a color filter; a three-color method in which light emission of red, green, and blue is used; and a color conversion method or a quantum dot method in which part of blue emission is converted into red light or green light.

In this embodiment, a structure including a liquid crystal element and an EL element as display elements is described with reference to FIGS. 12 to 14. Note that FIGS. 12 and 14 are cross-sectional views along the dashed-dotted line Q-R shown in FIG. 11 and shows a structure including a liquid crystal element as a display element, whereas FIG. 13 is a cross-sectional view along the dashed-dotted line Q-R shown in FIG. 11 and shows a structure including an EL element as a display element.

Figure 12:
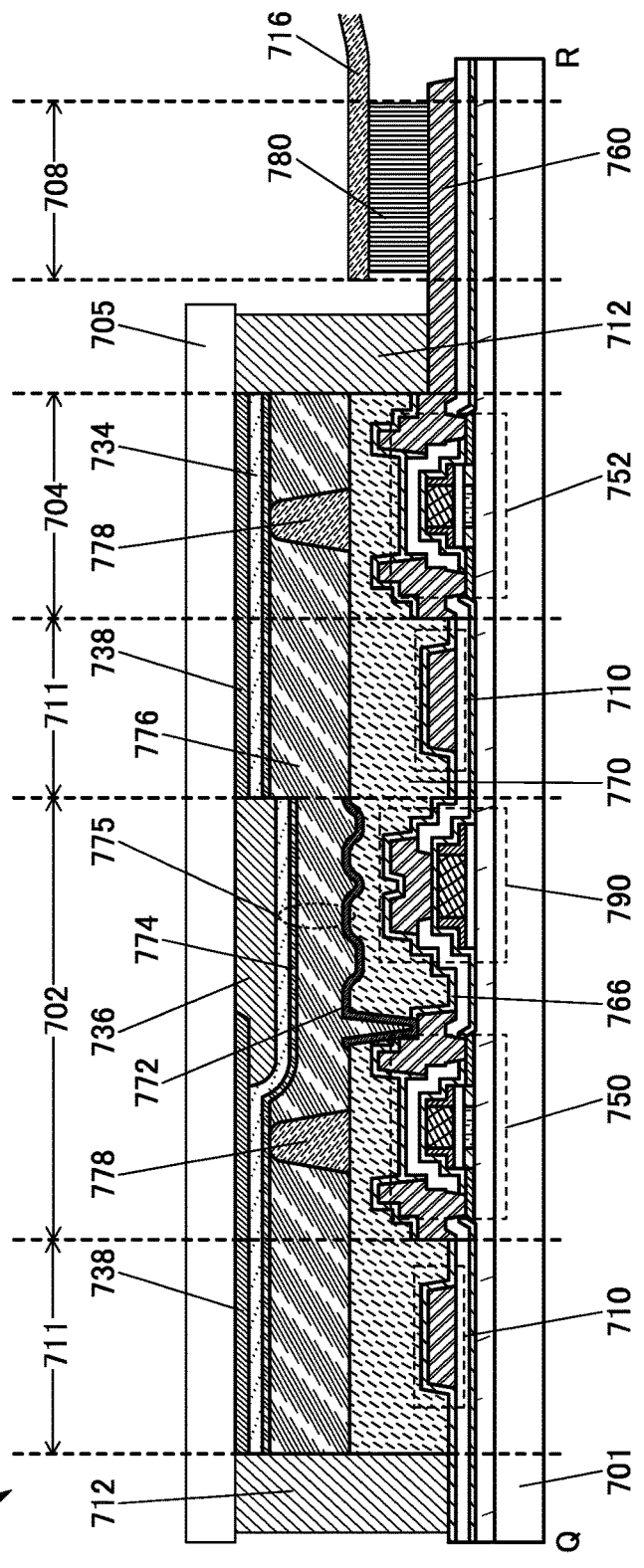
FIG. 12 is a cross-sectional view illustrating one mode of a display device.
Figure 13:
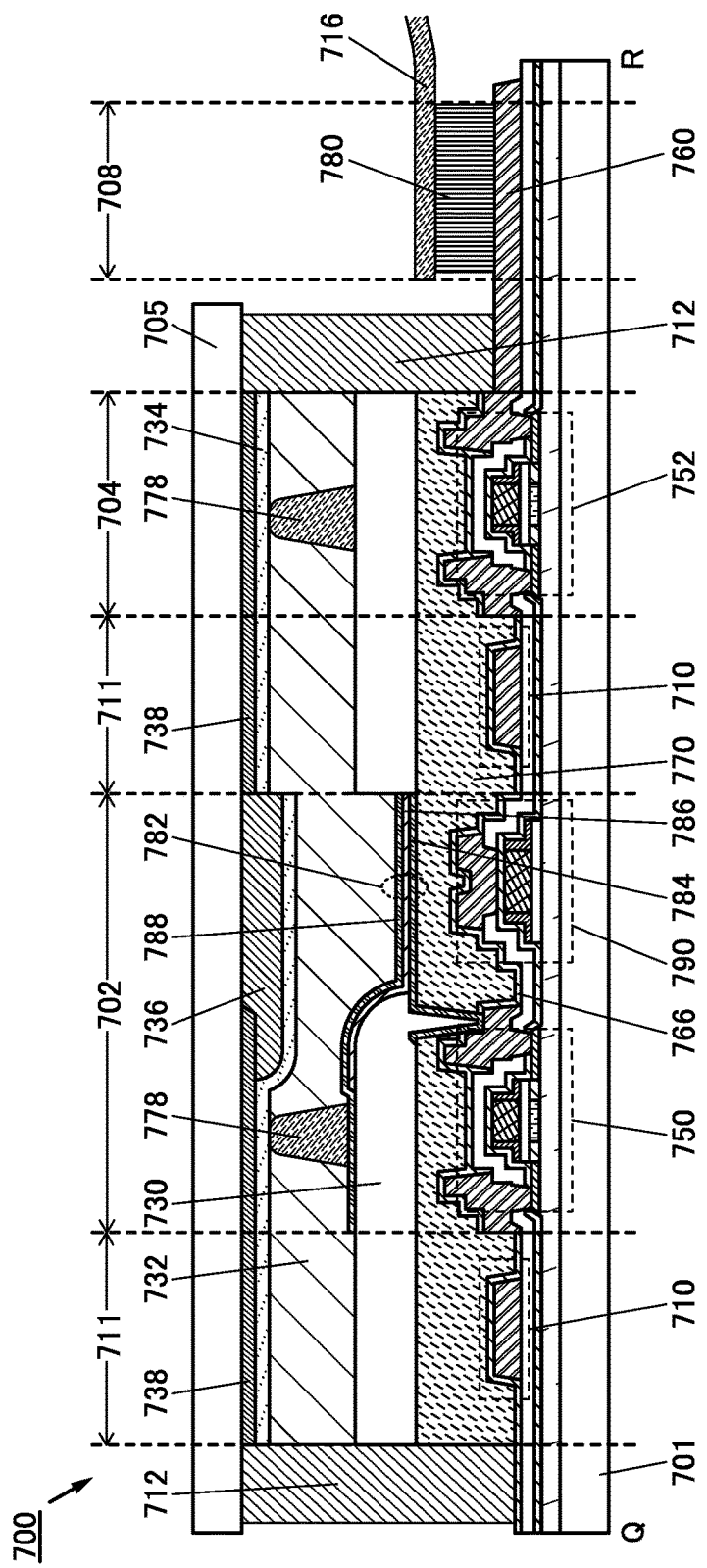
FIG. 13 is a cross-sectional view illustrating one mode of a display device.
Figure 14:
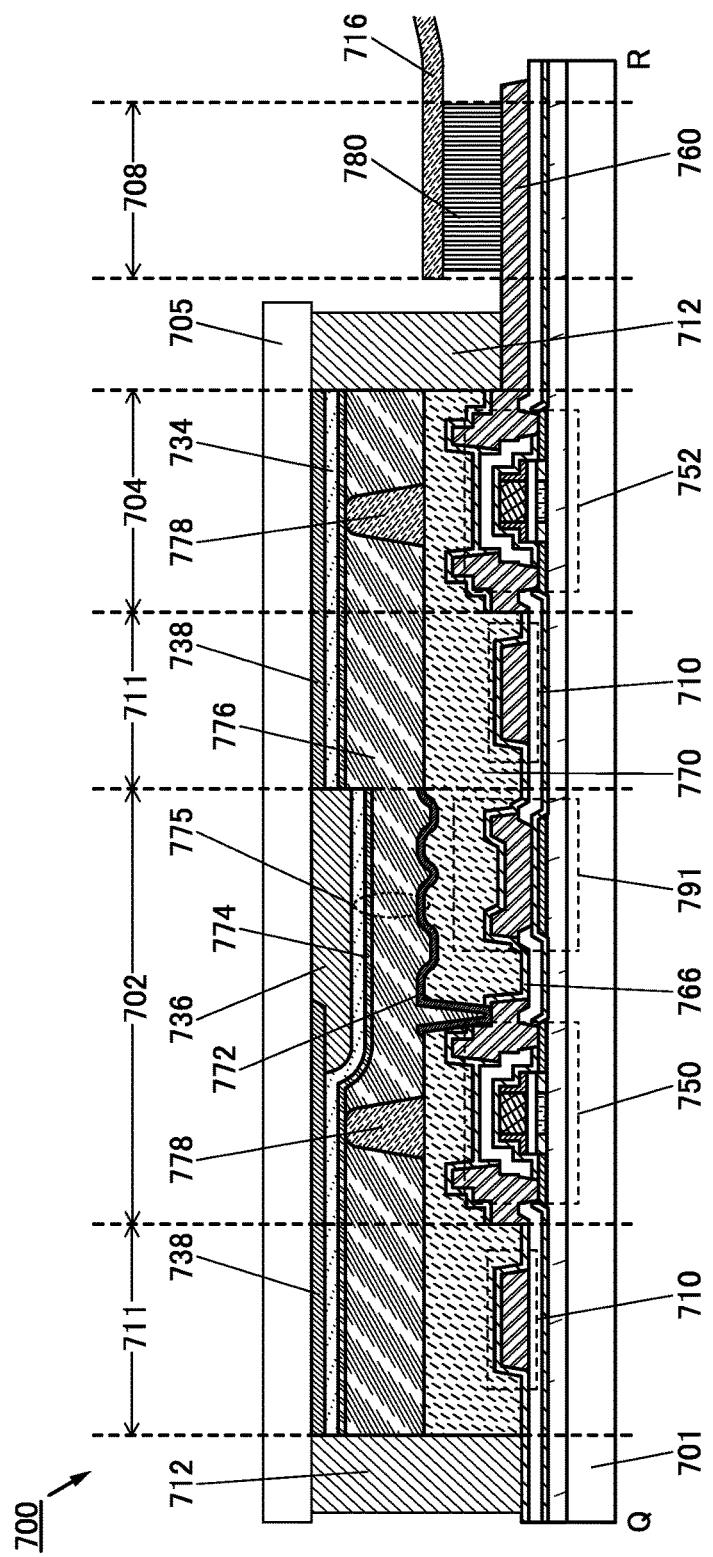
FIG. 14 is a cross-sectional view illustrating one mode of a display device.

Common portions between FIG. 12 and FIG. 13 are described first, and then different portions are described.
<Common Portions in Display Devices>

The display device 700 illustrated in FIG. 12 and FIG. 13 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have a structure of the other transistors described in any of the above embodiments.

The transistors used in this embodiment each include an oxide semiconductor film which is highly purified and in which formation of oxygen vacancies is suppressed. In the transistor, the off-state current can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a lower electrode and an upper electrode. The lower electrode is formed through a step of processing the same conductive film as the conductive film functioning as the gate electrode of the transistor 750. The upper electrode is formed through a step of processing the same conductive film as the conductive film functioning as the source electrode and the drain electrode of the transistor 750. Furthermore, the second insulating film of the transistor 750 is provided between the lower electrode and the upper electrode. That is, the capacitor 790 has a structure in which an insulating film functioning as a dielectric is provided between a pair of electrodes.

In FIG. 14, a capacitor 791 is used instead of the capacitor 790 of the display device 700 in FIG. 12.

The capacitor 791 includes a lower electrode and an upper electrode. The lower electrode is formed through a step of processing the same oxide semiconductor film as the oxide semiconductor film of the transistor 750. The upper electrode is formed through a step of processing the same conductive film as the conductive film functioning as the source electrode and the drain electrode of the transistor 750. Furthermore, the second insulating film of the transistor 750 is provided between the lower electrode and the upper electrode. That is, the capacitor 791 has a structure in which an insulating film functioning as a dielectric is provided between a pair of electrodes.

Note that the insulating films functioning as dielectrics of the capacitor 790 and the capacitor 791 can each be formed by removing the insulating film over the second insulating film when the opening portions for electrically connecting the conductive films functioning as the source electrode and the drain electrode of the transistor 750 to the oxide semiconductor film are formed. The insulating film over the second insulating film can be removed in the same step as or in a different step from the formation of the opening portions for electrically connecting the conductive films functioning as the source electrode and the drain electrode to the oxide semiconductor film. Note that in the case where the removal of the insulating film over the second insulating film and the formation of the opening portions are performed in the same step, the removal and the formation can be performed by using a gray-tone mask or a half-tone mask. Note that in the case where the capacitor 790 and the capacitor 791 work with small capacitance, the insulating film over the second insulating film is not necessarily removed.

Furthermore, as in the third regions, an impurity element is added to the oxide semiconductor film that functions as the lower electrode of the capacitor 791. The oxide semiconductor film that functions as the lower electrode of the capacitor 791 is in contact with the second insulating film. Hydrogen is supplied from the second insulating film to the oxide semiconductor film functioning as the lower electrode of the capacitor 791, whereby the oxide semiconductor film has increased carrier concentration and can be used as the lower electrode of the capacitor. Thus, the oxide semiconductor film that functions as the lower electrode of the capacitor 791 can be referred to as an oxide conductive (OC) film.

In FIG. 12 and FIG. 13, an insulating film 766 and a planarization insulating film 770 are provided over the transistor 750, the transistor 752, and the capacitor 790.

The insulating film 766 can be formed using a material and a method similar to that of the insulating film 128 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed through the same process as conductive films functioning as a source electrode and a drain electrode of the transistor 750 or 752. Note that the signal line 710 may be formed using a conductive film which is formed through a different process from a source electrode and a drain electrode of the transistor 750 or 752, e.g., a conductive film formed through the same process as a conductive film functioning as a gate electrode. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Alternatively, a spherical spacer may be used as the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 12 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 12 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display device 700 in FIG. 12 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver is preferably used for the conductive film that reflects visible light. In this embodiment, the conductive film that reflects visible light is used for the conductive film 772.

Note that projections and depressions are provided in part of the planarization insulating film 770 of the pixel portion 702 in the display device 700 in FIG. 12. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 12 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 12, an alignment film may be provided on a side of the conductive film 772 in contact with the liquid crystal layer 776 and on a side of the conductive film 774 in contact with the liquid crystal layer 776. Although not illustrated in FIG. 12, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal showing a blue phase and a chiral material has a short response time and optical isotropy, which eliminates the need for an alignment process. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 13 includes a light-emitting element 782. The light-emitting element 782 includes a conductive film 784, an EL layer 786, and a conductive film 788. The display device 700 shown in FIG. 13 is capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. For example, a material including one kind selected from indium (In), zinc (Zn), and tin (Sn) is preferably used for the conductive film that transmits visible light. For example, a material including aluminum or silver is preferably used for the conductive film that reflects visible light.

In the display device 700 shown in FIG. 13, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 shown in FIG. 13, the structure is not limited thereto. In the case where the EL layer 786 is formed by a separate coloring method, the coloring film 736 is not necessarily provided.

The structure described in this embodiment can be used in appropriate combination with the structure described in any of the other embodiments.

(Embodiment 4)

In this embodiment, a display device that includes a semiconductor device of one embodiment of the present invention is described with reference to FIGS. 15A to 15C.

The display device illustrated in FIG. 15A includes a region including pixels of display elements (hereinafter the region is referred to as a pixel portion 502), a circuit portion provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504*a*) and a circuit for supplying a signal (data signal) to drive a display element in a pixel (hereinafter, the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter, such wirings are referred to as scan lines GL_1 to GL_X). Note that a plurality of gate drivers 504*a* may be provided to control the scan lines GL_1 to GL_X separately. Alternatively, the gate driver 504*a* has a function of supplying an initialization signal. Without being limited thereto, the gate driver 504*a* can supply another signal.

The source driver 504*b* includes a shift register or the like. The source driver 504*b* receives a signal (video signal) from which a data signal is derived, as well as a signal for driving the shift register, through the terminal portion 507. The source driver 504*b* has a function of generating a data signal to be written to the pixel circuit 501 which is based on the video signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches or the like, for example. The source driver 504*b* can output, as the data signals, signals obtained by time-dividing the video signal by sequentially turning on the plurality of analog switches.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 15A:
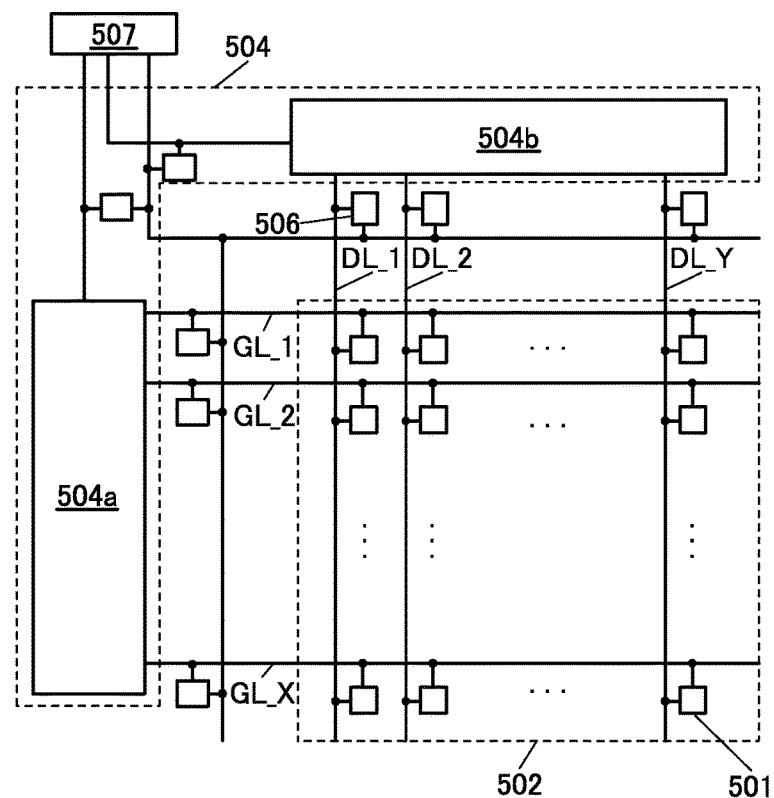
FIGS. 15A to 15C are a block diagram and circuit diagrams illustrating a display device.

The protection circuit 506 shown in FIG. 15A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 15A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504*a* or the protection circuit 506 may be configured to be connected to the source driver 504*b*. Alternatively, the protection circuit 506 may be configured to be connected to the terminal portion 507.

In FIG. 15A, an example in which the driver circuit portion 504 includes the gate driver 504*a* and the source driver 504*b* is shown; however, the structure is not limited thereto. For example, only the gate driver 504*a* may be formed and a separately prepared substrate where a source driver circuit is formed (e.g., a driver circuit substrate formed with a single crystal semiconductor film or a polycrystalline semiconductor film) may be mounted.

Figure 15B:
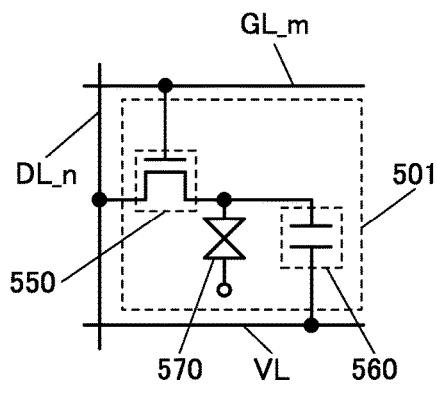

Each of the plurality of pixel circuits 501 in FIG. 15A can have the structure illustrated in FIG. 15B, for example.

The pixel circuit 501 illustrated in FIG. 15B includes a liquid crystal element 570, a transistor 550, and a capacitor 560. As the transistor 550, any of the transistors described in the above embodiments, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As a driving method of the display device including the liquid crystal element 570, any of the following modes can be used, for example: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 15B, the pixel circuits 501 are sequentially selected row by row by the gate driver 504*a* illustrated in FIG. 15A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 15C:
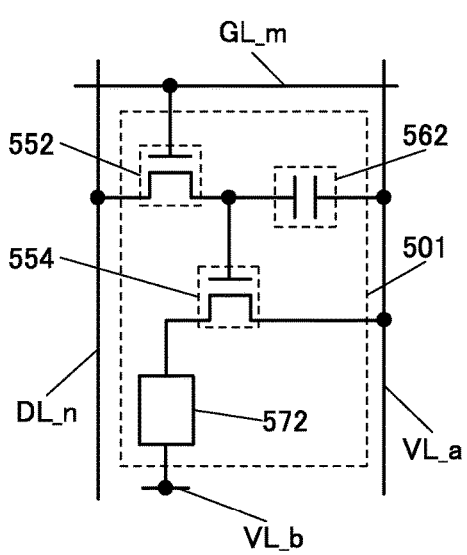

Alternatively, each of the plurality of pixel circuits 501 in FIG. 15A can have the structure illustrated in FIG. 15C, for example.

The pixel circuit 501 illustrated in FIG. 15C includes transistors 552 and 554, a capacitor 562, and a light-emitting element 572. Any of the transistors described in the above embodiments, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 15C, the pixel circuits 501 are sequentially selected row by row by the gate driver 504*a* illustrated in FIG. 15A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structure described in this embodiment can be used in appropriate combination with the structure described in any of the other embodiments.

(Embodiment 5)

In this embodiment, a display module and electronic appliances that include a semiconductor device of one embodiment of the present invention will be described with reference to FIG. 16 and FIGS. 17A to 17G.

Figure 16:
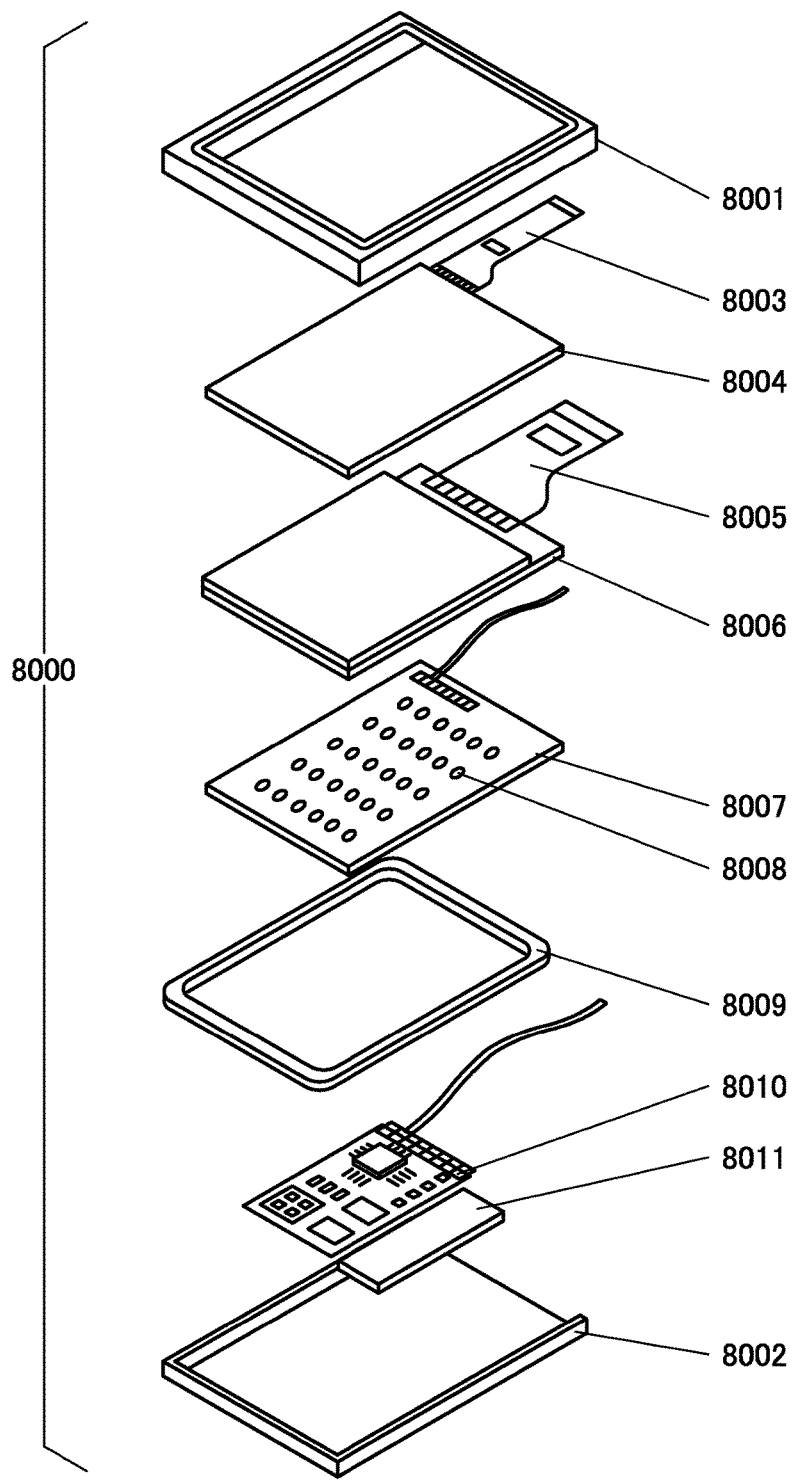
FIG. 16 illustrates a display module.

In a display module 8000 illustrated in FIG. 16, a touch panel 8004 connected to an FPC 8003, a display panel 8006 connected to an FPC 8005, a backlight 8007, a frame 8009, a printed circuit board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 16, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 17A to 17G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic appliances illustrated in FIGS. 17A to 17G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic appliances illustrated in FIGS. 17A to 17G are not limited to those described above, and the electronic appliances can have a variety of functions. Although not illustrated in FIGS. 17A to 17G, the electronic appliance may include a plurality of display portions. Furthermore, the electronic appliance may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic appliances illustrated in FIGS. 17A to 17G are described in detail below.

Figure 17A:
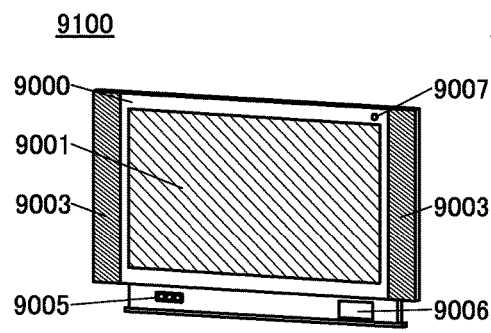
FIGS. 17A to 17G illustrate electronic appliances.

FIG. 17A is a perspective view illustrating a television device 9100. The television device 9100 can include the display portion 9001 having a large screen size of, for example, 50 inches or more, or 100 inches or more.

Figure 17B:
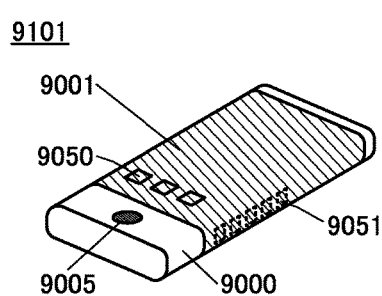

FIG. 17B is a perspective view illustrating a portable information terminal 9101. The portable information terminal 9101 function as, for example, one or more of a telephone set, a notebook, and an information browsing system. Specifically, the portable information terminal 9101 can be used as a smartphone. Note that the portable information terminal 9101 may include the speaker, the connection terminal, the sensor, and the like. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS massage; the date; the time; remaining battery; and the reception strength of an antenna. Alternatively, the operation buttons 9050 or the like may be displayed in place of the information 9051.

Figure 17C:
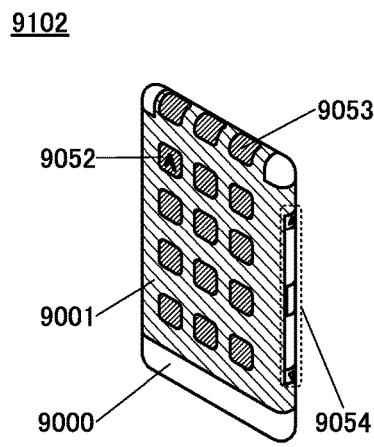

FIG. 17C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 17D:
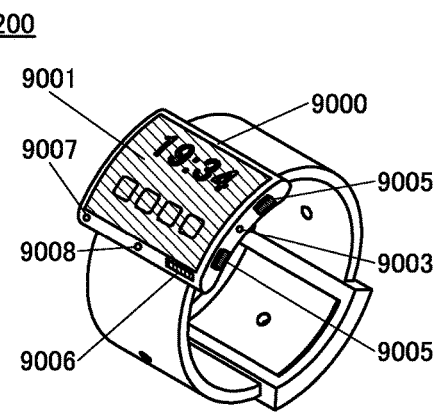

FIG. 17D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Figure 17E:
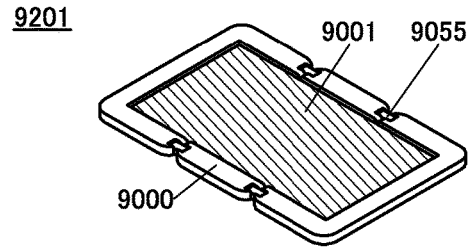
Figure 17F:
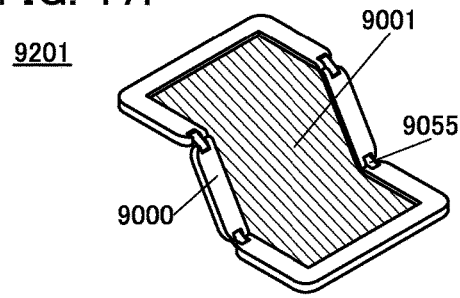
Figure 17G:
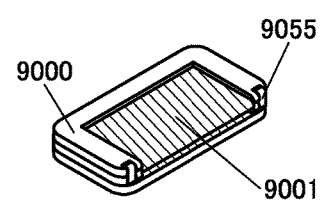

FIGS. 17E, 17F, and 17G are perspective views each illustrating a foldable portable information terminal 9201. FIG. 17E is a perspective view illustrating the portable information terminal 9201 that is opened, FIG. 17F is a perspective view illustrating the portable information terminal 9201 that is being opened or being folded, and FIG. 17G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic appliances described in this embodiment each include the display portion for displaying some sort of data. Note that the semiconductor device of one embodiment of the present invention can also be used for an electronic appliance that does not have a display portion.

The structure described in this embodiment can be used in appropriate combination with the structure described in any of the other embodiments.

This application is based on Japanese Patent Application serial no. 2014-137696 filed with Japan Patent Office on Jul. 3, 2014, the entire contents of which are hereby incorporated by reference.

What is claimed is:

1. A semiconductor device comprising a transistor, the transistor comprising:
   an oxide semiconductor film over a first insulating film;
   a gate insulating film over the oxide semiconductor film;
   a gate electrode over the gate insulating film;
   a conductive film in contact with a side surface of the gate electrode in a channel length direction; and
   a second insulating film over the oxide semiconductor film,
   wherein the oxide semiconductor film comprises:
      a first region overlapping with the gate electrode;
      a second region overlapping with the conductive film; and
      a third region in contact with the second insulating film,
   wherein the second region and the third region comprise an impurity element,
   wherein an impurity element concentration of the third region is higher than an impurity element concentration of the second region,
   wherein an end portion of the conductive film is substantially aligned with an interface between the second region and the third region, and
   wherein a length of the second region in the channel length direction is smaller than 20% of a length of the first region in the channel length direction.

2. The semiconductor device according to claim 1, wherein the third region functions as a source region or a drain region of the transistor.

3. The semiconductor device according to claim 1, wherein the impurity element is one or more of hydrogen, boron, carbon, nitrogen, fluorine, phosphorus, sulfur, and a rare gas.

4. The semiconductor device according to claim 1, wherein the third region comprises at least one of hydrogen and argon.

5. The semiconductor device according to claim 1, wherein a hydrogen concentration of the third region is higher than a hydrogen concentration of the second region.

6. The semiconductor device according to claim 1, wherein the oxide semiconductor film comprises oxygen, indium, zinc, and M, and
   wherein M is titanium, gallium, tin, yttrium, zirconium, lanthanum, cerium, neodymium, or hafnium.

7. The semiconductor device according to claim 1, wherein the oxide semiconductor film comprises a crystal part, and
   wherein a c-axis of the crystal part is parallel to a normal vector to a surface of the oxide semiconductor film.

8. The semiconductor device according to claim 1, wherein the second insulating film comprises hydrogen.

9. The semiconductor device according to claim 1, wherein an end portion of the conductive film is substantially aligned with an end portion of the gate insulating film.

10. The semiconductor device according to claim 1, wherein the second insulating film is in contact with a top surface of the gate electrode, a surface of the conductive film, an end portion of the conductive film, and an end portion of the gate insulating film.

11. The semiconductor device according to claim 1, wherein the length of the second region in the channel length direction is smaller than 10% of the length of the first region in the channel length direction.

12. The semiconductor device according to claim 1, wherein the length of the second region in the channel length direction is smaller than 5% of the length of the first region in the channel length direction.

13. The semiconductor device according to claim 1, wherein an end portion of the conductive film is substantially aligned with a position where concentration of the impurity element in the oxide semiconductor film changes.

14. The semiconductor device according to claim 1, wherein the impurity element concentration of the second region is uniform in the channel length direction.

15. A display device comprising:
the semiconductor device according to claim 10; and
a display element.

16. A display module comprising:
the display device according to claim 15; and
a touch sensor.

17. A semiconductor device comprising a transistor, the transistor comprising:
a first gate electrode;
a first insulating film over the first gate electrode;
an oxide semiconductor film over the first insulating film;
a gate insulating film over the oxide semiconductor film;
a second gate electrode over the gate insulating film;
a conductive film in contact with a side surface of the second gate electrode in a channel length direction; and
a second insulating film over the oxide semiconductor film, wherein the oxide semiconductor film comprises:
- a first region overlapping with the second gate electrode;
- a second region overlapping with the conductive film; and
- a third region in contact with the second insulating film, wherein the second region and the third region comprise an impurity element, wherein an impurity element concentration of the third region is higher than an impurity element concentration of the second region, wherein an end portion of the conductive film is substantially aligned with an interface between the second region and the third region, and wherein a length of the second region in the channel length direction is smaller than 20% of a length of the first region in the channel length direction.

18. The semiconductor device according to claim 17, wherein the third region functions as a source region or a drain region of the transistor.

19. The semiconductor device according to claim 17, wherein the impurity element is one or more of hydrogen, boron, carbon, nitrogen, fluorine, phosphorus, sulfur, and a rare gas.

20. The semiconductor device according to claim 17, wherein the third region comprises at least one of hydrogen and argon.

21. The semiconductor device according to claim 17, wherein a hydrogen concentration of the third region is higher than a hydrogen concentration of the second region.

22. The semiconductor device according to claim 17, wherein the oxide semiconductor film comprises oxygen, indium, zinc, and M, and
wherein M is titanium, gallium, tin, yttrium, zirconium, lanthanum, cerium, neodymium, or hafnium.

23. The semiconductor device according to claim 17, wherein the second insulating film comprises hydrogen.

24. The semiconductor device according to claim 17, wherein an end portion of the conductive film is substantially aligned with an end portion of the gate insulating film.

25. The semiconductor device according to claim 17, wherein the second insulating film is in contact with a top surface of the second gate electrode, a surface of the conductive film, an end portion of the conductive film, and an end portion of the gate insulating film.

26. The semiconductor device according to claim 17, wherein the length of the second region in the channel length direction is smaller than 10% of the length of the first region in the channel length direction.

27. The semiconductor device according to claim 17, wherein the length of the second region in the channel length direction is smaller than 5% of the length of the first region in the channel length direction.

28. The semiconductor device according to claim 17, wherein an end portion of the conductive film is substantially aligned with a position where concentration of the impurity element in the oxide semiconductor film changes.

29. The semiconductor device according to claim 17, wherein the impurity element concentration of the second region is uniform in the channel length direction.

* * * * *